United States Patent
Seok

(10) Patent No.: US 10,217,847 B2
(45) Date of Patent: Feb. 26, 2019

(54) POWER TRANSISTOR WITH INCREASED AVALANCHE CURRENT AND ENERGY RATING

(71) Applicant: IXYS Corporation, Milpitas, CA (US)

(72) Inventor: Kyoung Wook Seok, Milpitas, CA (US)

(73) Assignee: IXYS, LLC, Milpitas, CA (US)

( * ) Notice: Subject to any disclaimer, the term of this patent is extended or adjusted under 35 U.S.C. 154(b) by 660 days.

(21) Appl. No.: 14/290,994

(22) Filed: May 30, 2014

(65) Prior Publication Data

US 2014/0273384 A1  Sep. 18, 2014

Related U.S. Application Data

(63) Continuation of application No. 13/413,715, filed on Mar. 7, 2012, now Pat. No. 8,742,451, which is a (Continued)

(51) Int. Cl.
*H01L 29/66* (2006.01)
*H01L 29/417* (2006.01)
(Continued)

(52) U.S. Cl.
CPC .... *H01L 29/66681* (2013.01); *H01L 29/1095* (2013.01); *H01L 29/41766* (2013.01);
(Continued)

(58) Field of Classification Search
CPC ......... H01L 29/66681; H01L 29/66727; H01L 29/41766; H01L 29/1095; H01L 29/7395; H01L 29/66674; H01L 29/7801
See application file for complete search history.

(56) References Cited

U.S. PATENT DOCUMENTS

| | | | | |
|---|---|---|---|---|
| 5,891,776 A * | 4/1999 | Han | ................ | H01L 29/1095 257/E21.382 |
| 5,973,361 A * | 10/1999 | Hshieh | ............ | H01L 21/26586 257/330 |
| 6,121,089 A * | 9/2000 | Zeng | ................ | H01L 29/1095 257/E21.418 |
| 6,664,595 B1 * | 12/2003 | Yun | ................ | H01L 29/0696 257/341 |

(Continued)

OTHER PUBLICATIONS

Jun Zeng and C. Frank Wheatley, *An Improved Power MOSFET Using a Novel Split Well Structure*, 1999 IEEE, 205-208 (4 pages).
(Continued)

*Primary Examiner* — Thanhha Pham

(57) ABSTRACT

A field-effect transistor involves a drain electrode, a drift region, a body region, a source region, a gate insulator layer, and a gate electrode. The drift region is disposed above the drain electrode. The body region extends down into the drift region from a first upper semiconductor surface. The source region is ladder-shaped and extends down in the body region from a second upper semiconductor surface. The first and second upper semiconductor surfaces are substantially planar and are not coplanar. A first portion of the body region is surrounded laterally by a second portion of the body region. The second portion of the body region and the drift region meet at a body-to-drift boundary. The body-to-drift boundary has a central portion that is non-planar. A gate insulator layer is disposed over the source region and a gate electrode is disposed over the gate insulator.

23 Claims, 18 Drawing Sheets

CROSS-SECTIONAL SIDE VIEW OF THE INTEGRATED CIRCUIT
FABRICATED USING THE STEPS SHOWN IN FIGURE 6
(TAKEN ALONG LINE A-A OF FIG. 18)

Related U.S. Application Data continuation-in-part of application No. 13/113,797, filed on May 23, 2011, now Pat. No. 8,741,709.

(60) Provisional application No. 61/347,793, filed on May 24, 2010.

(51) Int. Cl.
*H01L 29/10* (2006.01)
*H01L 29/739* (2006.01)
*H01L 29/78* (2006.01)
*H01L 29/06* (2006.01)

(52) U.S. Cl.
CPC .. *H01L 29/66333* (2013.01); *H01L 29/66727* (2013.01); *H01L 29/7395* (2013.01); *H01L 29/7811* (2013.01); *H01L 29/0619* (2013.01)

(56) References Cited

U.S. PATENT DOCUMENTS

| | | | |
|---|---|---|---|
| 8,048,740 B2 | 11/2011 | Venkatraman | 438/268 |
| 8,741,709 B2 | 6/2014 | Seok et al. | |
| 2003/0151092 A1 | 8/2003 | Chien | |
| 2010/0025748 A1* | 2/2010 | Mauder | H01L 21/26513 257/296 |
| 2012/0273875 A1 | 11/2012 | Yedinak et al. | 257/330 |

OTHER PUBLICATIONS

Jun Zeng, C. Frank Wheatley, Rick Stokes, Chris Kocon, and Stan Benczkowski, *Optimization of the Body-Diode of Power MOSFETs for High Efficiency Synchronous Rectification*, ISPSD 2000, May 22-25, Toulouse, France (4 pages).

* cited by examiner

UIS TEST CIRCUIT

UIS WAVEFORM
DURING SWITCHING

EQUIVALENT CIRCUIT AND
CROSS SECTION

A TYPICAL TOP-DOWN VIEW OF VERTICAL
POWER FIELD EFFECT TRANSISTOR

CROSS-SECTIONAL VIEW OF INTEGRATED CIRCUIT
ILLUSTRATING AVALANCHE CURRENT PATHS

TOP-DOWN VIEW OF THE ACTIVE AREA OF THE
SEMICONDUCTOR WAFER DURING STEPS 206 AND 306

EXPANDED CUT-AWAY TOP-DOWN VIEW OF
RECTANGLE 53 DURING STEP 207 AND STEP 307

EXPANDED CUT-AWAY TOP-DOWN VIEW OF
RECTANGLE 53 DURING STEP 209 AND STEP 309

EXPANDED CUT-AWAY TOP-DOWN VIEW OF
RECTANGLE 53 DURING STEP 210 AND STEP 310

EXPANDED CUT-AWAY TOP-DOWN VIEW OF
RECTANGLE 53 DURING STEP 212

EXPANDED CUT-AWAY TOP-DOWN VIEW OF
RECTANGLE 53 DURING STEP 218

EXPANDED CUT-AWAY TOP-DOWN VIEW OF RECTANGLE 53
DURING STEP 311

EXPANDED CUT-AWAY TOP-DOWN VIEW OF RECTANGLE 53
DURING STEP 318

TOP-DOWN VIEW OF VERTICAL POWER FIELD-EFFECT TRANSISTOR

EXPANDED TOP-DOWN VIEW OF RECTANGLE 62 OF FIG. 16

EXPANDED TOP-DOWN VIEW OF
RECTANGLE 63 OF FIG. 17

CROSS-SECTIONAL SIDE VIEW OF THE INTEGRATED CIRCUIT
FABRICATED USING THE STEPS SHOWN IN FIGURE 6
(TAKEN ALONG LINE A-A OF FIG. 18)

CROSS-SECTIONAL SIDE VIEW OF THE INTEGRATED CIRCUIT
FABRICATED USING THE STEPS SHOWN IN FIGURE 7
(TAKEN ALONG LINE A-A OF FIG. 18)

CROSS-SECTIONAL VIEW OF INTEGRATED CIRCUIT SHOWN IN FIG. 20 ILLUSTRATING AVALANCHE CURRENT PATHS

| REGION | TYPE | DOPANT | FORMATION | DOPING CONCENTRATION (ATOMS/CCM) | JUNCTION DETPTH (MICRONS) |
|---|---|---|---|---|---|
| SOURCE REGION | N+ | PHOSPHORUS | DIFFUSION FROM SURFACE | 1.E+19 | 0.4um |
| FIRST PORTION OF BODY REGION | P+ | BORON | DIFFUSION FROM SURFACE | 5.E+17 | 0.7um |
| SECOND PORTION OF BODY REGION | P | BORON | DIFFUSION FROM SURFACE | 1.E+14 | 2.0um |
| DRIFT REGION | N- | PHOSPHORUS | EPI GROWN FROM SUBSTRATE | 1.E+14 | 40um |
| DRAIN ELECTRODE REGION | N | PHOSPHORUS | SUBSTRATE | 1.E+17 | 110um |

DOPING PROFILE FOR IMPROVED
BREAKDOWN VOLTAGE TRANSISTOR DEVICE

FIG. 22

POWER TRANSISTOR WITH INCREASED AVALANCHE CURRENT AND ENERGY RATING

CROSS REFERENCE TO RELATED APPLICATIONS

This application is a continuation of, and claims the benefit under 35 U.S.C. § 120 from, nonprovisional U.S. patent application Ser. No. 13/413,715, entitled "Power Transistor With Increased Avalanche Current And Energy Rating," filed on Mar. 7, 2012, now U.S. Pat. No. 8,742,451. U.S. patent application Ser. No. 13/413,715 is a continuation-in-part of, and claims priority under 35 U.S.C. § 120 from, nonprovisional U.S. patent application Ser. No. 13/113,797 entitled "Vertical Power MOSFET and IGBT Fabrication Process with Two Fewer Photomasks," filed on May 23, 2011, now U.S. Pat. No. 8,741,709. U.S. patent application Ser. No. 13/113,797 claims the benefit under 35 U.S.C. § 119 from provisional U.S. patent application Ser. No. 61/347,793 entitled "Power MOSFET and IGBT Fabrication Process Using a Reduced Number of Photo Masks," filed on May 24, 2010. The entire subject matter of application Ser. Nos. 13/413,715, 13/113,797, and 61/347,793 is incorporated herein by reference.

TECHNICAL FIELD

The described embodiments relate to field-effect transistors, and more particularly to power field-effect transistors.

BACKGROUND INFORMATION

Power Field-Effect Transistors ("FET"s) are required to operate properly in extreme conditions. The semiconductor industry defines "ruggedness" as the capability of the FET to withstand extreme conditions when subjected to Unclamped Inductive Switching ("UIS"). Two mechanisms cause FET failure during UIS testing. The first failure mechanism is bipolar failure, also known as active mode failure. The second failure mechanism is thermal failure, also known as passive mode failure. Bipolar failure results when an avalanche current forces the parasitic bipolar transistor within the FET into conduction. Thermal failure results when the instantaneous chip temperature exceeds a maximum temperature. At this elevated temperature, thermal regeneration or "mesoplasma" forms within the parasitic bipolar transistor within the FET and causes catastrophic thermal runaway. Both failure mechanisms result in irreparable failure.

FIG. 1 (Prior Art) is a simplified circuit diagram of an UIS test circuit 1. The UIS test circuit 1 comprises a FET under test 2, an inductor 3, a voltage source 4, and a current meter 5. The FET 2 has a gate, source and drain terminal. The source terminal of FET 2 is coupled to ground. The gate terminal of FET 2 is coupled to a test input voltage waveform $V_{gs}$. The drain terminal of the FET 2 is coupled to a first terminal of inductor 3. A second terminal of inductor 3 is couple to a first terminal of voltage source 4. A second terminal of voltage source 4 is coupled to ground. Current meter 5 measures the current flowing through FET 2. The UIS test circuit 1 applies a test input voltage waveform $V_{gs}$ to the gate terminal of FET 2 and measures the resulting current flowing through FET 2.

When current flowing through an inductance is quickly switched off, the magnetic field of the inductor induces a counter electromagnetic force ("EMF") that can generate a very high voltage across the controlling switch. Mechanical switches often have spark-suppression circuits to dissipate these high voltages without causing damage to the switch. However, when using a FET switch the high voltages generated across the FET may far exceed the rated breakdown voltage ($V_{BR(DSS)}$) of the FET, thus resulting in catastrophic failure. Breakdown voltage is the maximum voltage at which the FET is guaranteed to properly operate. The voltage applied across the controlling switch can be expressed as:

$$V_{switch} = L\, di/dt + V_{DD} \qquad \text{Eq. (1)}$$

where L is the inductance of inductor 3, and $V_{DD}$ is the amplitude of voltage supplied by voltage source 4. The energy absorbed by the switch may be expressed as:

$$E = \frac{1}{2} I_0^2 \times L \left[ \frac{V_{BR(eff)}}{V_{BR(eff)} - V_{DD}} \right] \qquad \text{Eq. (2)}$$

where, $I_0$ is the peak current flowing through FET 2 before FET 2 is switched off, and $V_{BR(EFF)}$ is the voltage present across FET 2.

FIG. 2 (Prior Art) is a waveform diagram of UIS signals during switching. The input signal $V_{gs}$ is set to an ON voltage level from time $t_o$ to time $t_1$. An ON voltage is a voltage level high enough to cause the FET to a conducting state. At time $t_1$ input signal $V_{gs}$ is set to an OFF voltage level. An OFF voltage is a voltage level below the ON voltage where the FET enters a non-conducting state. Input signal $V_{gs}$ remains at an OFF voltage level from time $t_1$ to $t_3$. The current flowing through FET 2 increases from time $t_o$ to time $t_1$. At time $t_1$ FET 2 switches off and causes an abrupt break in the drain current of FET 2. Given that the current of the inductor cannot change instantaneously, a voltage is induced on the drain of FET 2 in accordance with equation 1. The induced voltage across FET 2 may exceed the breakdown voltage of the FET 2. When the voltage across FET 2 exceeds the breakdown voltage of FET 2, an avalanche current may be induced in FET 2. The inductor forces a decreasing flow of current from time $t_1$ to time $t_2$. During this period, the potential across FET 2 is clamped at $V_{BR(EFF)}$ and the current in the inductor decays linearly from $I_o$ to zero, as is shown in FIG. 2. The inductor current decay time may be expressed as:

$$t_{AV} = \left[ \frac{I_0 \times L}{V_{BR(eff)} - V_{DD}} \right] \qquad \text{Eq. (3)}$$

At time $t_2$ inductor 3 ceases to conduct current and the voltage across FET 2 falls to $V_{DD}$. From time $t_2$ to time $t_3$ the UIS test circuit 1 is in a steady state with zero current flowing through FET 2 and constant voltage of $V_{DD}$ applied to the drain terminal of FET 2.

The bipolar failure effect refers to the activation and subsequent secondary breakdown of the parasitic bipolar transistor. The intrinsic diode of a FET is the collector-base junction of the parasitic bipolar transistor. Current cascading laterally through the p body region of the FET is considered responsible for the bipolar failure effect. A voltage induced by the laterally cascading current ($I_oR_p$) activates the parasitic bipolar transistor.

FIG. 3 (Prior Art) illustrates a model of the bipolar failure effect mode in the vertical FET structure. The bipolar failure effect model 2 comprises a gate terminal 7, p type body 8, n type drift layer 9, n type substrate 10, n type source region 11, lateral body resistance ($R_P$) 12, source electrode 13, vertical body resistance ($R_B$) 14, inherent Zener diode region 15, and parasitic bipolar transistors 16. When the voltage applied across the FET exceeds the rated breakdown voltage, an avalanche current 17 may be induced. The initial avalanche current 17 at breakdown is heavily concentrated near the inherent Zener diode region 15. Avalanche current concentrated in the inherent Zener diode region does not normally initiate bipolar action because the lateral resistance $R_P$ 12 is much greater than vertical resistance $R_B$ 14. However, as the avalanche current 17 increases, the avalanche current 17 also spreads across the p/n junction and results in avalanche currents 17 cascading laterally through the p type body region 8. These laterally cascading avalanche currents develop sufficient bias voltage across the lateral body resistances $R_P$ 12 and activate parasitic bipolar transistors 16. The bias voltage may be expressed as:

$$V_{BE}=I_A \times R_P \qquad \text{Eq. (4)}$$

where, $V_{BE}$ is the bias voltage, $I_A$ is the laterally cascading avalanche current, and $R_P$ is the lateral resistance 12. Activation of the parasitic bipolar transistors 16 results in hot spotting and lowering of the turn on voltage of parasitic bipolar transistors 16. As such, thermal regeneration (also known as mesoplasma formation) occurs leading to runaway and irreversible failure.

The temperature of the FET may increase without activating parasitic bipolar transistors 16. As the FET is subjected to increasing avalanche current, the internal temperature of the FET rises dramatically. Avalanche currents cause a drastic increase in energy that must be dissipated by the FET. The calculation of the energy present in the FET as a result of avalanche current is presented in equation 2 above. The resulting energy in the FET is not easily dissipated and therefore causes the temperature of the FET to rise significantly. If the rise in internal temperature of the FET exceeds the maximum operation temperature of the FET, thermal regeneration (also known as mesoplasma formation) will occur. Thermal regeneration leads to irreversible damage generally associated with thermal runaway.

FIG. 4 (Prior Art) is a typical top view of a vertical power field effect transistor 18. The top surface of a typical vertical power FET 18 comprises a ring area 19, a gate bus area 20, an active area 21, a gate bus terminal 22, and a active area terminal 23. The active area 21 is the center area. The gate bus area 20 surrounds the active area 21. The ring area 19 surrounds the gate bus area 20. The active area 21 is where the top metal layer is connected to the body and source regions of the power FET device. The gate-bus area 20 is where the top metal layer is connected to the gate electrode so to control the gate voltage. The ring area 19, or junction termination area, allows high voltages to be sustained when operating in blocking mode.

SUMMARY

In one specific example, a Field-Effect Transistor (FET) involves a drain electrode, a substrate region, a drift region, a body region, a source region, a gate insulator layer, and a gate electrode. The drift region is disposed over the substrate region. The substrate region is disposed over the drain electrode. The body region extends down into the drift region from a first upper semiconductor surface. The source region is ladder-shaped and extends down in the body region from a second upper semiconductor surface. The first and second upper semiconductor surfaces are substantially planar and are not coplanar. A first portion of the body region is surrounded laterally by a second portion of the body region. The second portion of the body region and the drift region meet at a body-to-drift boundary. The body-to-drift boundary has a central portion that is non-planar. A gate insulator layer is disposed over the source region and portion of the drift region. A gate electrode is disposed over the gate insulator.

A method of fabricating a FET involves forming a source region, a drift region, and a body region. The body region has a first and second portion. The second portion of the body region extends down into the drift region from a first upper semiconductor surface. The source region extends down into the body region from a second upper semiconductor surface. The second portion of the body region meets the drift region at a body-to-drift boundary having a central portion which is non-planar. The central portion of the drift region forms a central ridge that extends upward toward the first upper semiconductor surface.

In one example of the FET and the method of making the FET, the central ridge and the contour of the body-to-drift boundary causes a peak of an avalanche current to enter the body region at a point along the body-to-drift boundary that is located approximately beneath the source region. The central ridge and the contour of the body-to-drift boundary spreads the avalanche current such that the avalanche current path intersects the body-to-drift boundary at an area which is approximately beneath the source region.

In one specific example, the FET having the central ridge is manufactured in a semiconductor manufacturing process that uses no more than four mask steps. A first of the masks is a body and source forming implant mask. Whereas in another four-mask FET forming process there is no island of this mask remaining in the area above what will become the body region during the polysilicon defining step, in the method described here a small part of this mask is left above the center of what will later become the body region. This small part of the mask causes a small body-shaping polysilicon island structure to remain after the polysilicon layer defining step. The small body-shaping polysilicon island structure then causes the central ridge to form in subsequent processing steps. Accordingly, the central ridge can be formed without having to add another mask to the four-mask FET forming process.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 22 is a table that sets forth doping concentrations in the various regions and layers of the structure of the FET device of FIGS. 19 and 20.

DETAILED DESCRIPTION

Reference will now be made in detail to background examples and some embodiments of the invention, examples of which are illustrated in the accompanying drawings. In the description and claims below, when a first object is referred to as being disposed "over" a second object, it is to be understood that the first object can be directly on the second object, or an intervening object may be present between the first and second objects. Similarly, terms such as "above", "under", "beneath", "down" and "upward" are used herein to describe relative orientations between different parts of the transistor structure being described, and it is to be understood that the overall transistor structure being described can actually be oriented in any way in three-dimensional space. The present invention is explained with reference to an n-channel vertical power field-effect transistor; however, the present invention can also be applied to other transistor technologies including p-channel vertical power field effect transistors, p-channel insulated gate bipolar transistors, and n-channel insulated gate bipolar transistors.

Given that increased voltages in the body regions of a FET cause failure effects, it is desirable to design a FET which reduces the current flowing through greater lateral body resistance. Additionally, given that in either the lateral or vertical direction the body region has some resistance value per unit length, it is desirable to design a FET in which the avalanche current path from a body-to-drift boundary to source electrode travels a minimal distance through the body region of the FET.

Figure 5:
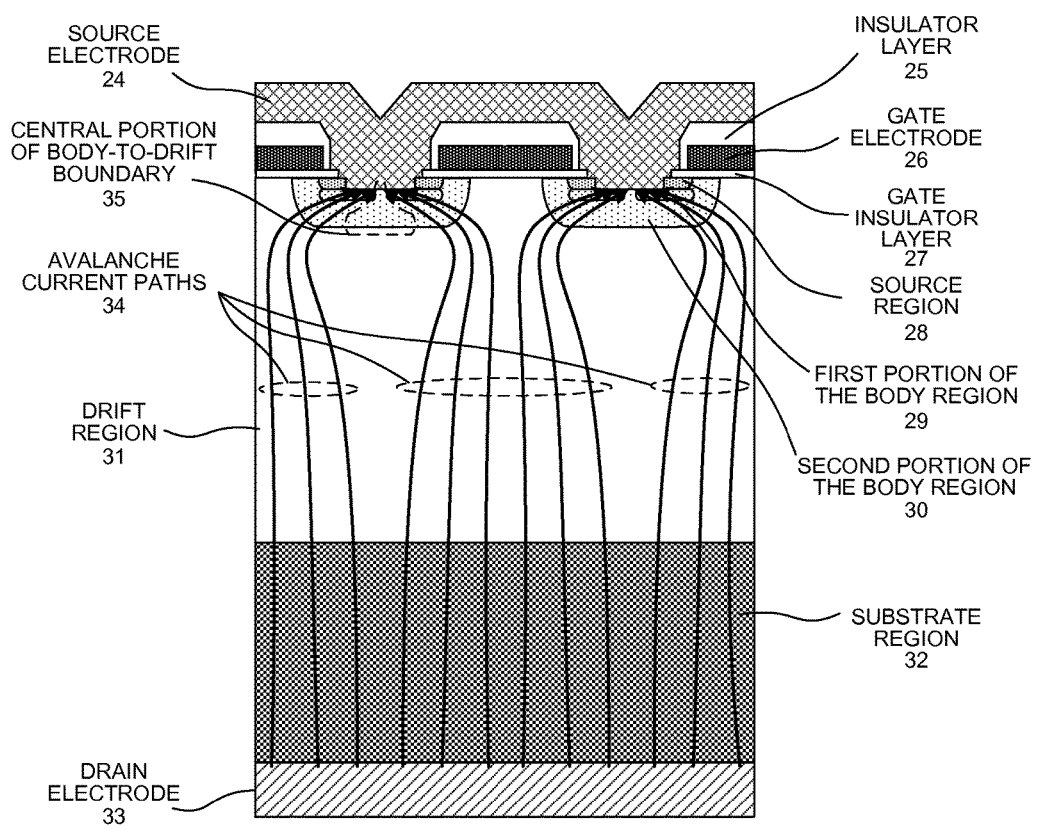
FIG. 5 is a cross-sectional view of the active region of a power field effect transistor.

FIG. 5 is a cross-sectional view of the active region of a power FET device. The active region of the typical power FET comprises source electrode 24, insulator layer 25, gate electrode 26, gate insulator layer 27, source regions 28, first body region 29, second body region 30, a drift region 31, a substrate region 32, and drain electrode 33. Drain electrode region 33 is the bottom layer of the active region. Substrate region 32 extends down to drain electrode region 33 from the bottom surface of drift region 31. Drift region 31 extends down to and contacts substrate region 31 from an upper surface of the semiconductor portion of the FET device. Second body region 30 extends down into drift region 31 from the upper surface of the semiconductor portion of the FET device. The boundary where the second body region 30 meets the drift region 30 is herein referred to as the "body-to-drift boundary". The central portion of the body-to-drift boundary 35 is planar. First body region 29 extends down into second body region 30 from the upper surface of the semiconductor portion of the FET device. Source region 28 extends down into both the first 29 and second body region 30 from the upper surface of the semiconductor portion of the FET device. Gate insulator layer 27 extends down to the upper surface of the semiconductor portion of the FET device from the bottom surface of gate insulator layer 27 and the bottom surface of gate electrode 26. Gate insulator layer 27 encapsulates the top and lateral surfaces of gate electrode 26. Gate insulator layer 27 provides electrical isolation between gate electrode 26 and source electrode 24. Source electrode 24 extends down to the upper surface of the semiconductor portion of the FET device from the top surface of the FET device. Source electrode 24 only contacts source region 28 and first body region 29 at the upper surface of the semiconductor portion of the FET.

During normal operation, the power FET device operates in two states: a blocking state or an on-state. In the blocking state, the voltage between the gate electrode 26 and the source region 28 is less than the threshold voltage and the drift region 31 holds the electric field. In the on-state, a voltage between applied between the gate electrode 26 and the source region 28 is greater than the threshold voltage and current flows from drain electrode region 33 and source region 28.

Figure 1:
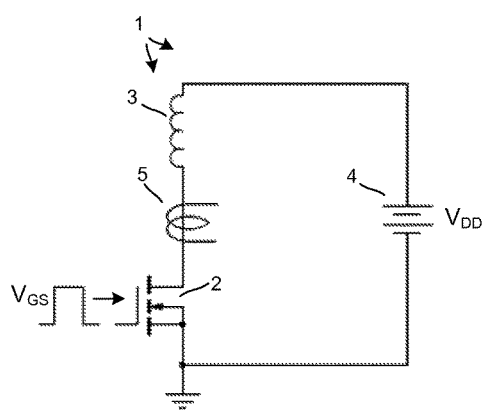
FIG. 1 (Prior Art) is a simplified circuit diagram of an unclamped inductive switching test circuit.
Figure 2:
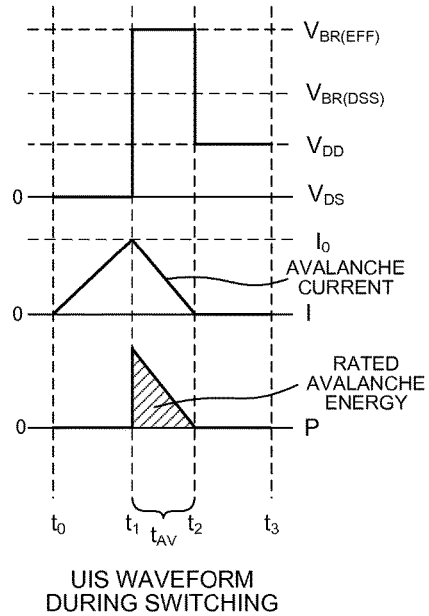
FIG. 2 (Prior Art) is a waveform diagram of unclamped inductive switching signals during testing.
Figure 3:
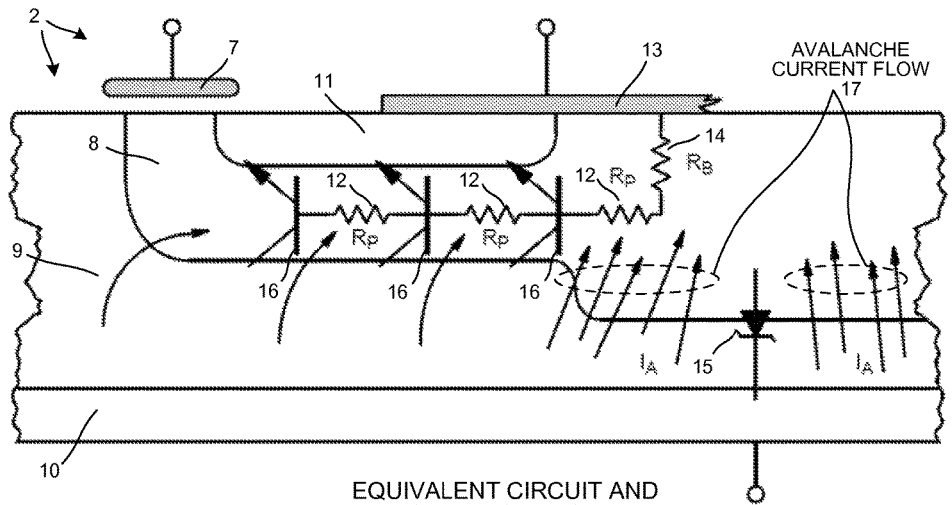
FIG. 3 (Prior Art) illustrates a model of the bipolar failure effect mode in the vertical field effect transistor structure.
Figure 4:
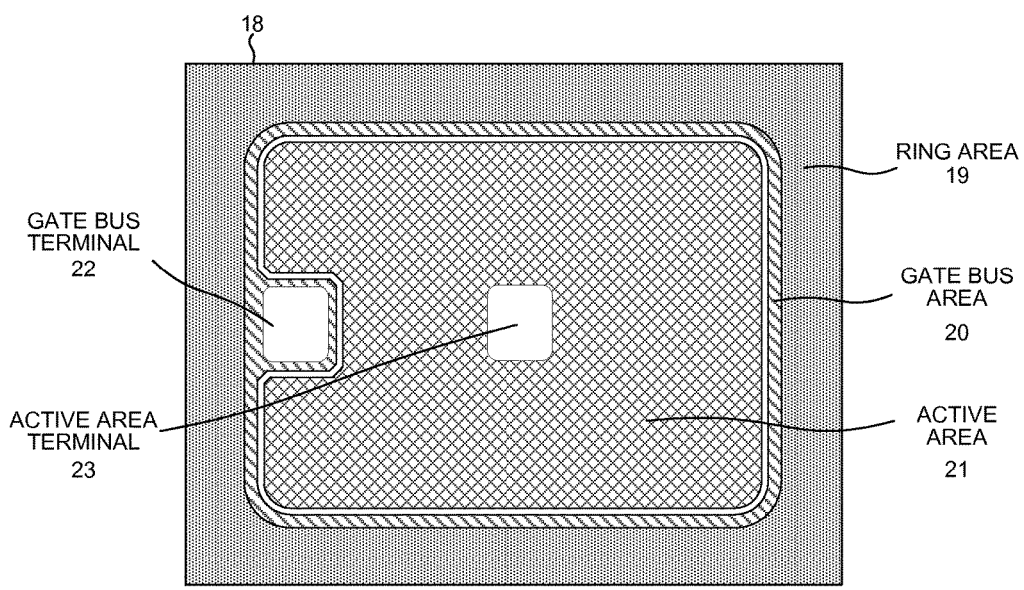
FIG. 4 (Prior Art) is a typical top-down view of a vertical power field effect transistor.

Avalanche current paths 34 are also shown in FIG. 5. Avalanche current paths 34 extend from drain electrode 33 to source electrode 24. The portion of the avalanche current paths 34 that are of paramount interest is the portion of the avalanche current paths that intersect the first 29 and second 30 body regions of the FET. The avalanche current paths in this portion are approximately parallel with the upper surface of the semiconductor surface of the FET. Referring to FIG. 3, it is noted that the lateral resistances $R_P$ 12 are greater than the vertical resistances $R_B$ 14. As such, a current traveling through lateral resistances $R_P$ 12 will generate a greater voltage than generated by the same current traveling through vertical resistances $R_B$ 14. At the non-planar corners of the body-to-drift boundary the increased curvature induces an increased electric field in comparison to the electric field present at planar portions of the body-to-drift boundary. The increased electric field near the non-planar portion of the body-to-drift boundary results in high current density near these non-planar portions.

Figure 6A:
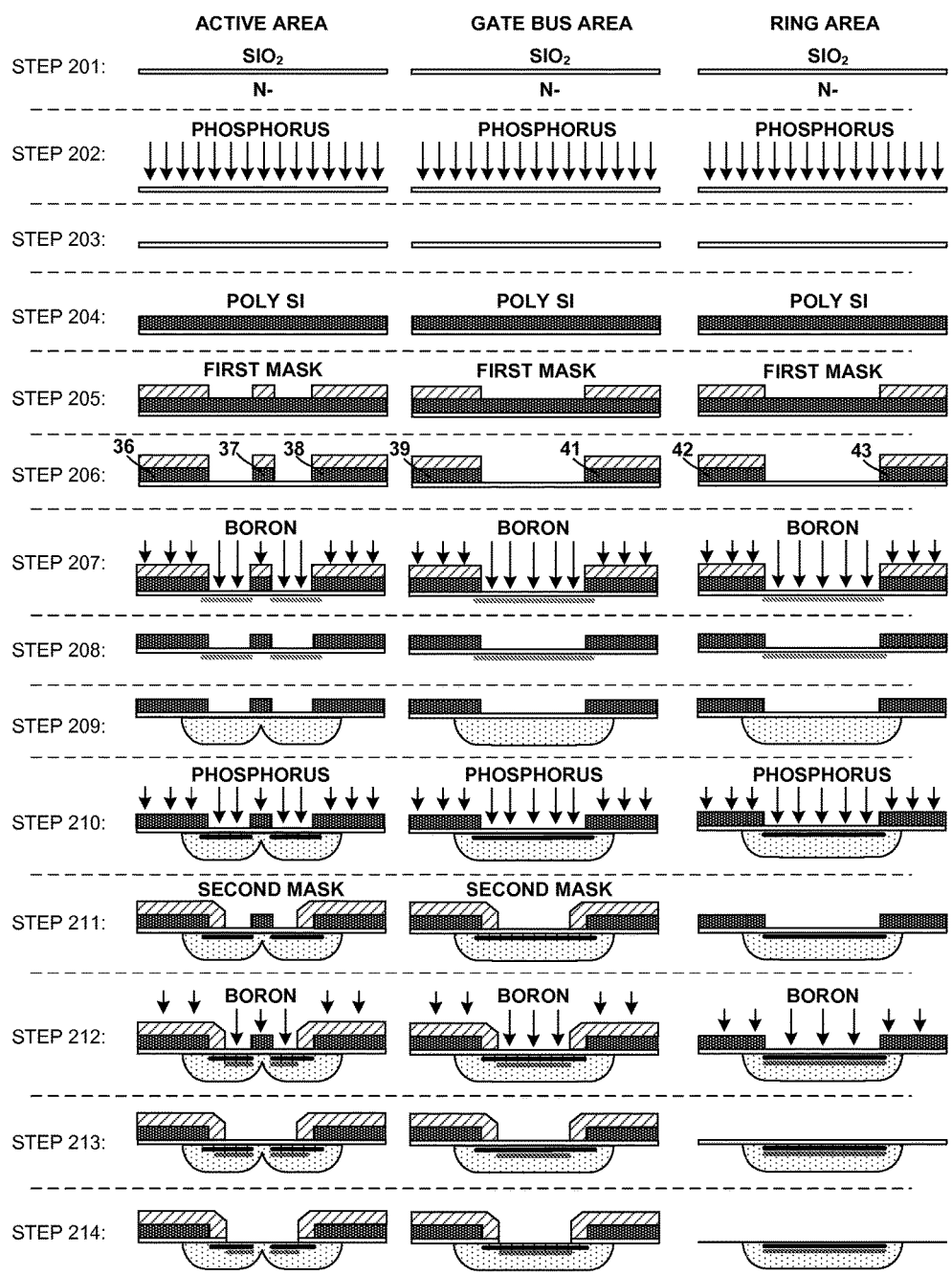
FIG. 6A is a diagram of the first fourteen steps of a twenty five step field effect transistor fabrication process in accordance with a first novel aspect.
Figure 19:
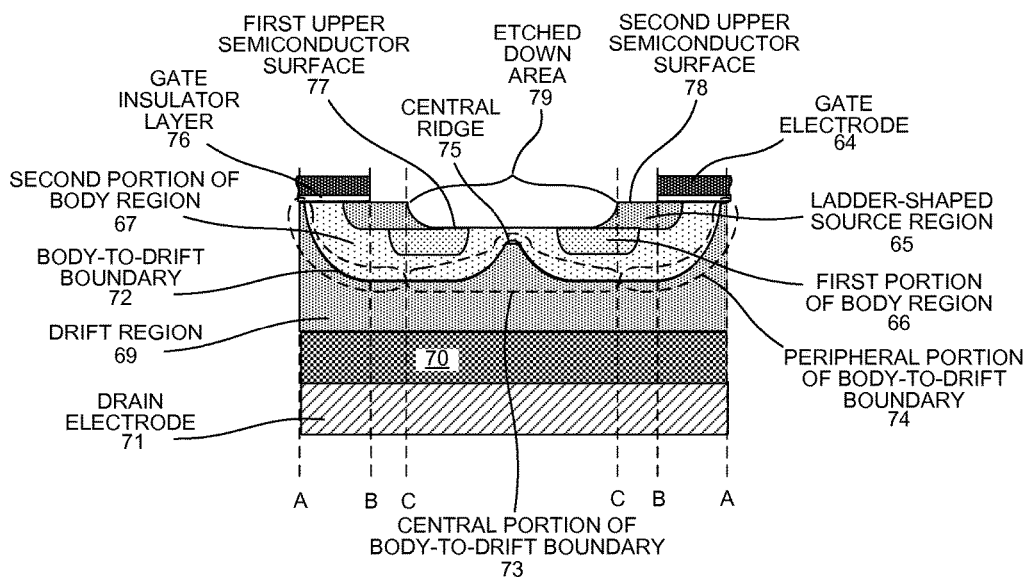
FIG. 19 is a cross-sectional side view taken along sectional line A-A of the integrated circuit shown in FIG. 18 in accordance with a first novel aspect.

FIG. 6A is a diagram of the first fourteen steps of a twenty five step process to fabricate an improved field effect transistor (FET) shown in FIG. 19. Each drawing in FIG. 6A illustrates the formation of a single p well in each area of the FET device. FIG. 6A displays three columns per step. The columns are labeled active area, gate bus area, and ring area. These areas correlate to similarly referenced areas shown in FIG. 16.

A thin oxide is deposited on n type silicon in the active area, gate bus area, and the ring area (step 201). Phosphorus is implanted evenly to the active area, gate bus area, and the ring area (step 202). The implanted phosphorus is diffused (step 203). Phosphorus diffusion may be achieved by an annealing process where the implanted material is heated to a temperature above a diffusion temperature, maintaining a suitable temperature, and then cooling the implanted material to room temperature. A poly silicon layer is deposited over the diffused phosphorus layer (step 204). Poly silicon is a silicon material composed of a number of smaller crystals in which the crystal lattice is non-continuous. A first mask is applied to the active area, gate bus area, and the ring area (step 205). The first mask may be a poly silicon photo mask. In the active area, the first mask is applied to a first poly silicon region 36, a second poly silicon region 37, and a third poly silicon region 38. In the gate bus area, the first mask is applied to a fourth poly silicon region 39, and a sixth poly silicon region 41. In the ring area, the first mask is applied to a seventh poly silicon region 42 and an eighth poly silicon region 43.

Figure 8:
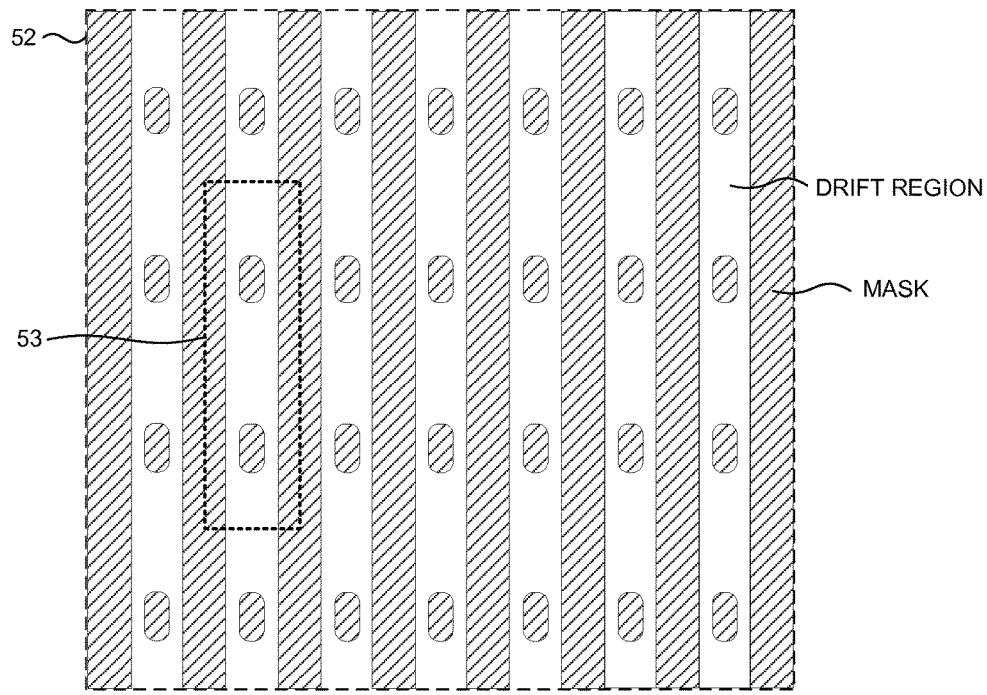
FIG. 8 is a top-down view of the active area of a semiconductor area.

The poly silicon material not protected by the first mask is etched away (step 206). Remaining poly silicon regions 36, 38, 39, and 41 are regions where the poly silicon layer will form a gate electrode, as well as control a first implantation of phosphorus and a first and second implantation of boron in the ring area throughout the proceeding steps. Remaining poly silicon regions 42 and 43 are used throughout the proceeding steps to control a first implantation of phosphorus and a first and second implantation of boron in the ring area. Poly silicon region 37 may be referred to as "body shaping" region because both poly silicon region affects the first implantation of boron, and thus also affect the shape of the resulting central portion of the body-to-drift boundary, where the second portion of the body region meets the drift region. FIG. 8 is a top-down view of the active area of the semiconductor wafer during step 206 of FIG. 6A. FIG. 8 shows that body shaping region 37, and the first mask deposited thereon, is an island formation located between poly silicon regions 36 and 38, where poly silicon regions 36 and 38, and the first mask deposited thereon, are vertical columns extending the across the active area.

Figure 9:
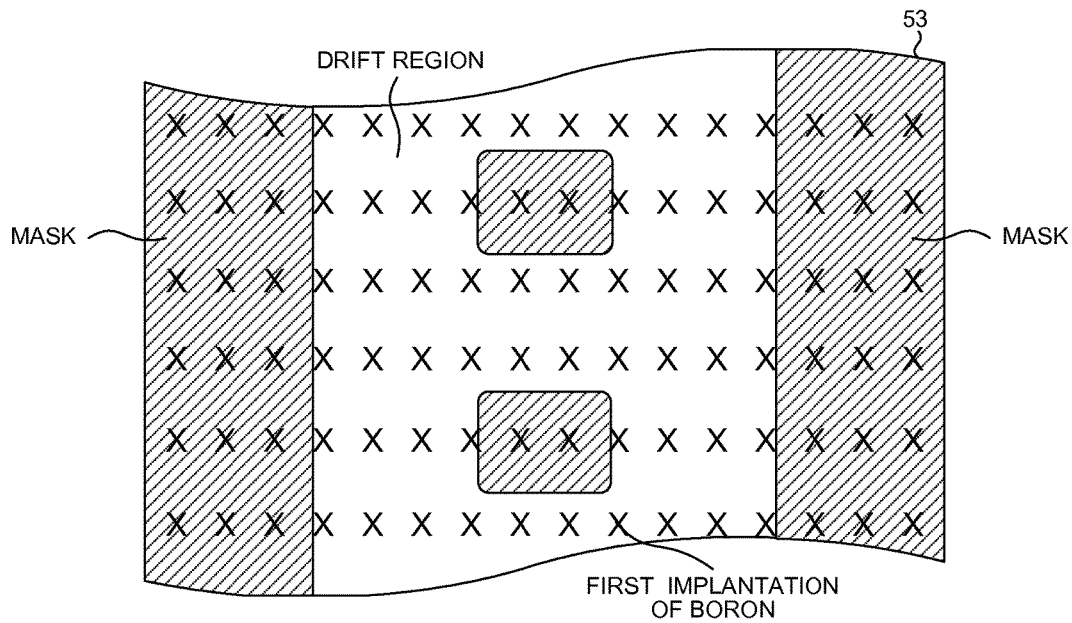
FIG. 9 is an expanded cut-away top-down view of rectangle 53 during step 207 of FIG. 6A and step 307 of FIG. 7A.

Boron is applied evenly across the active area, gate bus area, and ring area (step 207). As the first mask absorbs all incident boron, boron is implanted only the portion of the drift region not protected by the first mask. The gate oxide layer does not block boron implantation into the drift region. FIG. 9 is an expanded cut-away top-down view of rectangle 53 of FIG. 8 during step 207 of FIG. 6A. The gate oxide layer does not block boron implantation and is omitted in FIG. 9 for illustrative purposes. As is shown in FIG. 9, the portion of the drift region not protected by the first mask is ladder-shaped. As such, the first implantation of boron is only implanted in the exposed ladder-shaped top surface of the drift region. The first mask is removed from all areas (step 208).

Figure 10:
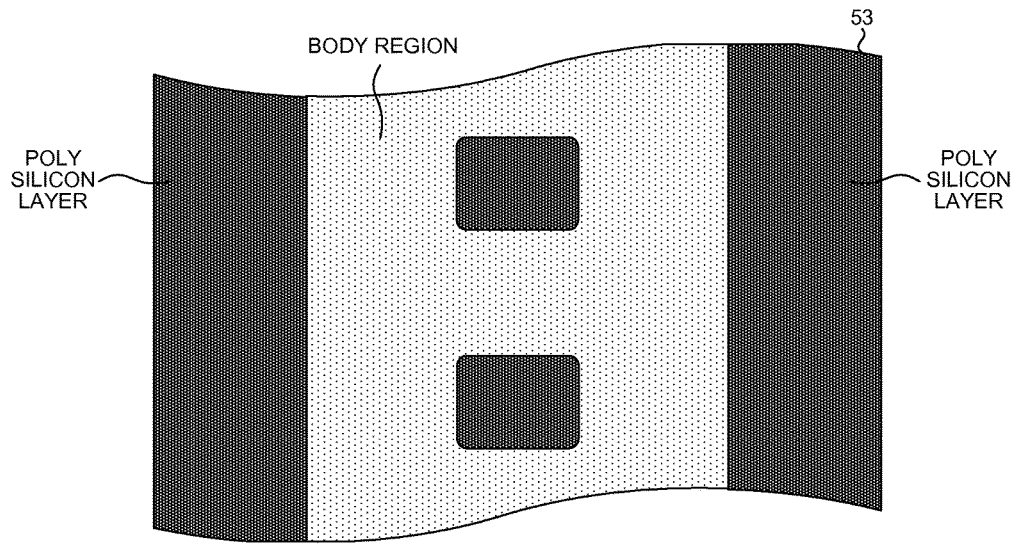
FIG. 10 is an expanded cut-away top-down view of rectangle 53 during step 209 of FIG. 6A and step 309 of FIG. 7A.

The implanted boron is diffused to create a second body portion of the body region (step 209). A p type body region is also commonly referred to as a "p-well". Boron diffusion may be achieved by an annealing process where the implanted material is heated to a temperature above a diffusion temperature, maintaining a suitable temperature, and then cooling the implanted material to room temperature. FIG. 10 is an expanded cut-away top-down view of rectangle 53 of FIG. 8 during step 209 of FIG. 6A.

The gate oxide layer is omitted in FIG. 10 for illustrative purposes. FIG. 10 shows that from the top-down perspective the top surface of the body region formed in step 209 is ladder-shaped. Depending on the amount of boron implanted and the diffusion processing used, the bottom-up perspective of the body region formed in step 209 may be either ladder-shaped or a single continuous surface. Upon completion of step 209, the top surface of the drift region is not exposed to the top surface of the semiconductor wafer.

Figure 11:
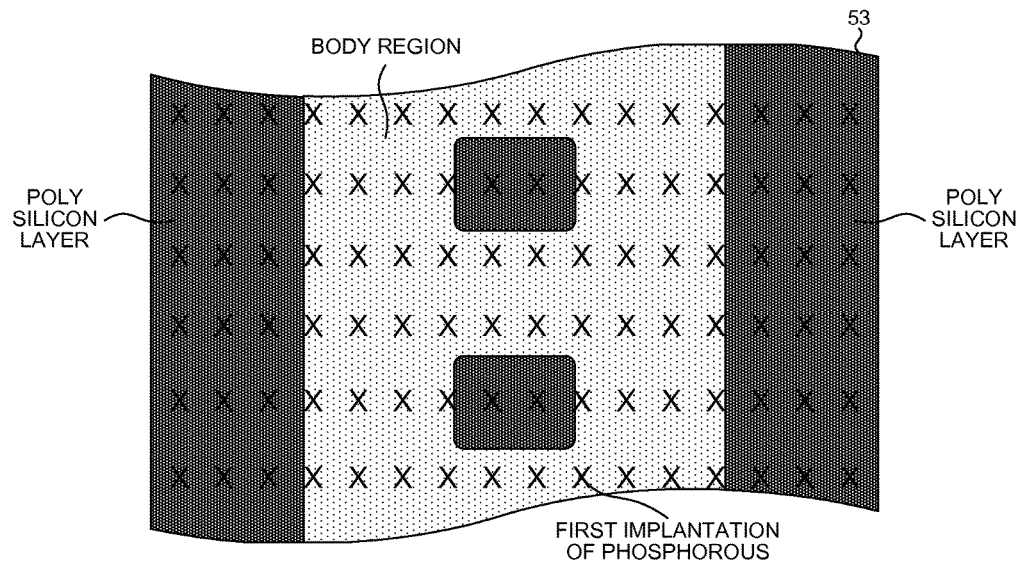
FIG. 11 is an expanded cut-away top-down view of rectangle 53 during step 210 of FIG. 6A and step 310 of FIG. 7A.

Phosphorus is applied evenly across the active area, gate bus area, and ring area (step 210). The remaining poly silicon layer absorbs all incident phosphorus. As a result, phosphorus is only implanted in the portion of the second body portion of the body region not protected by the remaining poly silicon layer. FIG. 11 is an expanded cutaway top-down view of rectangle 53 of FIG. 8 during step 210 of FIG. 6A. The gate oxide layer does not block phosphorus implantation and is omitted in FIG. 11 for illustrative purposes. As is shown in FIG. 11, the portion of the body region not protected by the poly silicon layer is ladder-shaped. As such, the first implantation of phosphorus is only implanted into the exposed ladder-shaped top surface of the body region.

A second mask is deposited on the active area and the gate bus area (step 211). The second mask may be a layer of photo resist material. In the active area, the second mask is deposited over the first poly silicon region 36, the third poly silicon region 38, and a portion of the exposed body region. In the gate bus area, the second mask is applied to the fourth poly silicon region 39, the sixth poly silicon region 41, and a portion of the exposed body region. The second mask is not applied to the ring area.

Figure 12:
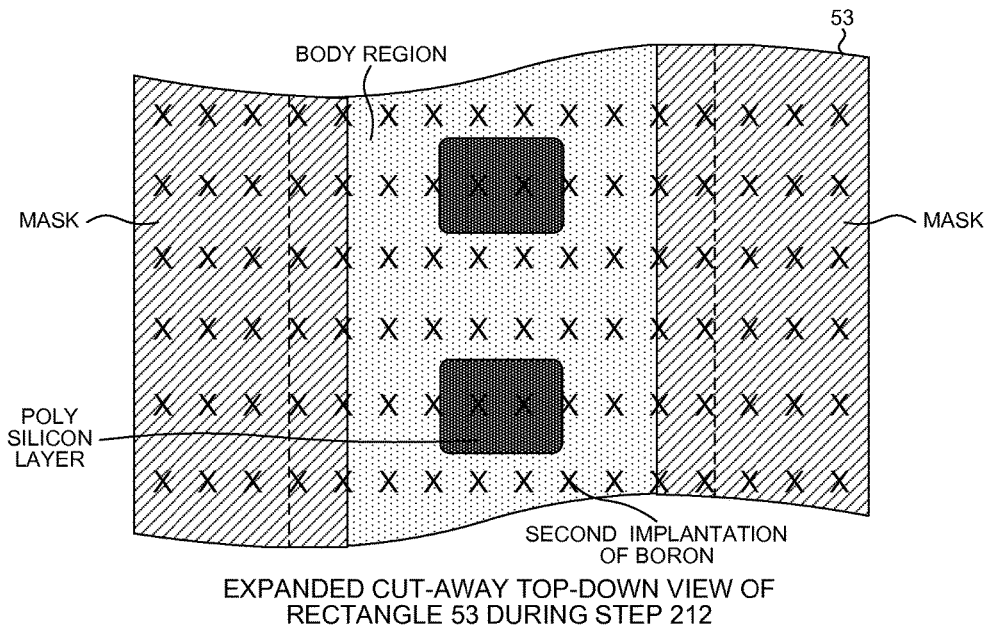
FIG. 12 is an expanded cut-away top-down view of rectangle 53 during step 212 of FIG. 6A.

A second implantation of boron is applied evenly across the active area, gate bus area, and ring area (step 212). The second mask absorbs all incident boron. As a result, in the active area boron is only implanted into the exposed ladder-shaped top surface of the body region. FIG. 12 is an expanded cut-away top-down view of rectangle 53 of FIG. 8 during step 212 of FIG. 6A. The gate oxide layer does not block boron implantation and is omitted in FIG. 12 for illustrative purposes. As is shown in FIG. 12, the exposed portion of the body region not protected by the second mask and poly silicon layer is ladder-shaped. Given the second mask is deposited over a portion of the body region, the exposed ladder-shaped top surface of the body region during the second implantation of boron is narrower in width than the exposed ladder-shaped top surface of the body region during the first implantation of phosphorus. The second implantation of boron is only implanted into the exposed ladder-shaped top surface of the body region. Likewise, in the gate bus area, the second implantation of boron is only implanted into the exposed ladder-shaped top surface of the body region. In the ring area, the remaining poly silicon layer absorbs all incident boron. As such, in the ring area, boron is only implanted into the exposed top surface of the body region.

The unprotected poly silicon layer in the ring area is etched away (step 213). As a result, all poly silicon is removed from the ring area. All unprotected portions of the silicon oxide layer are etched away from in the active area, gate bus area, and ring area (step 214).

Figure 6B:
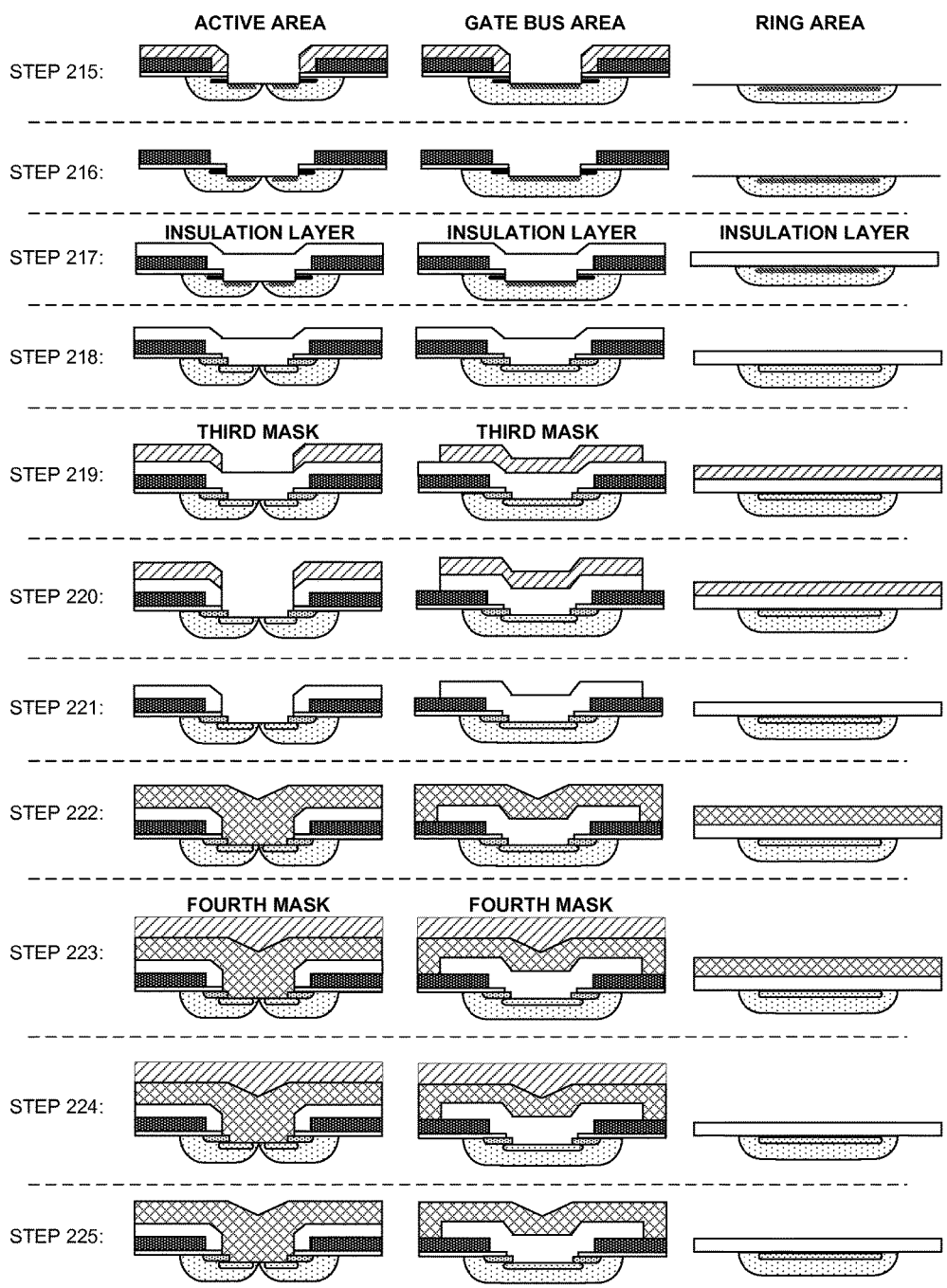
FIG. 6B is a diagram of the last eleven steps of a twenty five step field effect transistor fabrication process in accordance with a first novel aspect.

FIG. 6B is a diagram of the last eleven steps of a twenty five step process to fabricate an improved field effect transistor (FET) shown in FIG. 19. Each drawing in FIG. 6B illustrates the formation of a single p well in each area of the FET device. FIG. 6B displays three columns per step. The columns are labeled active area, gate bus area, and ring area. These areas correlate to similarly referenced areas shown in FIG. 16.

In the active area, gate bus area, and ring area a shallow portion of the body portion, which is not protected by the second mask, is etched away (step 215). The depth of the shallow etching is approximately equal to the depth of the phosphorus implantation. For example, the depth of the phosphorus implantation is 0.2 micrometers. As a result, a portion of the implanted phosphorus in the body region is etched away; however, the more deeply implanted boron remains in the body region. The shallow etching of step 215 creates an etched down area where the semiconductor surface extends up to a lower first upper semiconductor surface. The portion of the semiconductor not etched away extends up to a second upper semiconductor surface.

The second mask is removed (step 216). An insulation layer is deposed evenly to the active area, gate bus area, and ring area (step 217). The implanted phosphorus and boron is diffused (step 218). Diffusion may be achieved by an annealing process where the implanted material is heated to a temperature above a diffusion temperature, maintaining a suitable temperature, and then cooling the implanted material to room temperature. In the active area, gate bus area, and the ring area the diffused first implantation of phosphorus creates an n type source region and the diffused second implantation of boron creates a first portion of the body region. The first portion of the body region has a higher boron concentration than the second portion of the body region because the first portion of the body region is a result of the first and the second boron implantations, whereas the second portion of the body region is the result of only the first boron implantation. The increased boron concentration of the first portion of the body region reduces the parasitic resistance in the first portion of the body region. The reduction in parasitic resistance results in lower voltage generation in the first portion of the body region for a given current. Further, the increased doping of the first portion of the body region provides an improved contact between the first portion of the body region and the source electrode.

Figure 13:
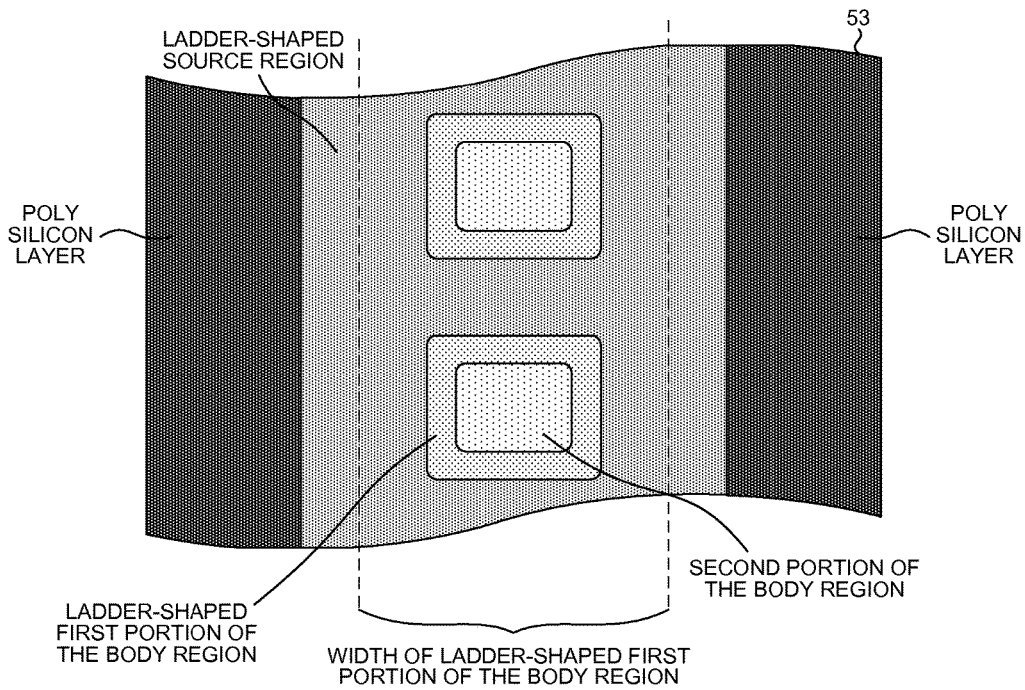
FIG. 13 is an expanded cut-away top-down view of rectangle 53 during step 218 of FIG. 6B.

FIG. 13 is an expanded cut-away top-down view of rectangle 53 of FIG. 8 during step 218 of FIG. 6B. The gate oxide layer and the insulator layer are omitted for illustrative purposes. FIG. 13 shows from a top-down perspective the second portion of the body region, as well as the first portion of the body region is visible within the etched down area that extends up to the first upper semiconductor surface. The ladder-shaped source region extends up to the second upper semiconductor surface from the first upper semiconductor surface. FIG. 13 further illustrates that the underlying first portion of the body region is also ladder-shaped, but has a horizontal width which is less than the horizontal width of the ladder-shaped source region.

A third mask is applied (step 219). The third mask may be a photo resist material. In the active area, the third mask is applied to the insulation layer above the first 36 and third 38 poly silicon regions and a portion of the source region. In the gate bus area, the third mask is applied to the entire area except an area above a portion of the fourth poly silicon region 39 and an area above a portion of the sixth poly silicon region 41. The third mask is applied to the entire ring area. All unprotected portions of the insulation layer are etched away (step 220). As a result, in the active area, the remaining insulation layer covers the first 36 and second 38 poly silicon regions and a portion of the gate oxide layer. In the gate bus area, a portion of insulation layer above fourth 39 and sixth 41 poly silicon regions is etched away.

The third mask is removed from all areas (step 221). A metal layer is deposited evenly to the active area, gate bus area, and the ring area to form a metal source electrode (step 222). In the active area, the metal layer contacts the first upper semiconductor surface. In the gate bus area, the metal layer contacts a portion of the fourth 39 and sixth 41 poly silicon regions. A fourth mask is applied to the entire active area and gate bus area (step 223). The fourth mask may be a photo resist material. The fourth mask is not applied to the entire ring area. The forth mask may be applied to a portion of the ring area near the gate bus area. The fourth mask may also be applied to a portion of the ring area near the edge of the FET. The fourth mask is not applied to the portion of the ring area shown FIG. 6B. The unprotected metal layer is etched way form the ring area (step 224). In the ring area, the entire metal layer is etched away. The fourth mask is removed (step 225). Completion of step 225 results in the FET shown in FIG. 19.

In the resulting structure, the more highly doped first portion of the body region abuts a portion of the bottom surface of the source region. The lesser doped second portion of the body region abuts the remaining portion of the bottom surface of the source region. Avalanche currents flow through the body region from the drift region into the source electrode. The first portion of the body region has a higher boron concentration and thus lower parasitic resistance. The second portion of the body region has a lower boron concentration and thus a higher parasitic resistance. Thus, the total resistance of the avalanche current path decreases as the percentage of the avalanche current path traveling through the first portion of the body region increases. An improved process minimizing the total resistance along the avalanche current path is disclosed in FIGS. 6A and 6B.

Figure 7A:
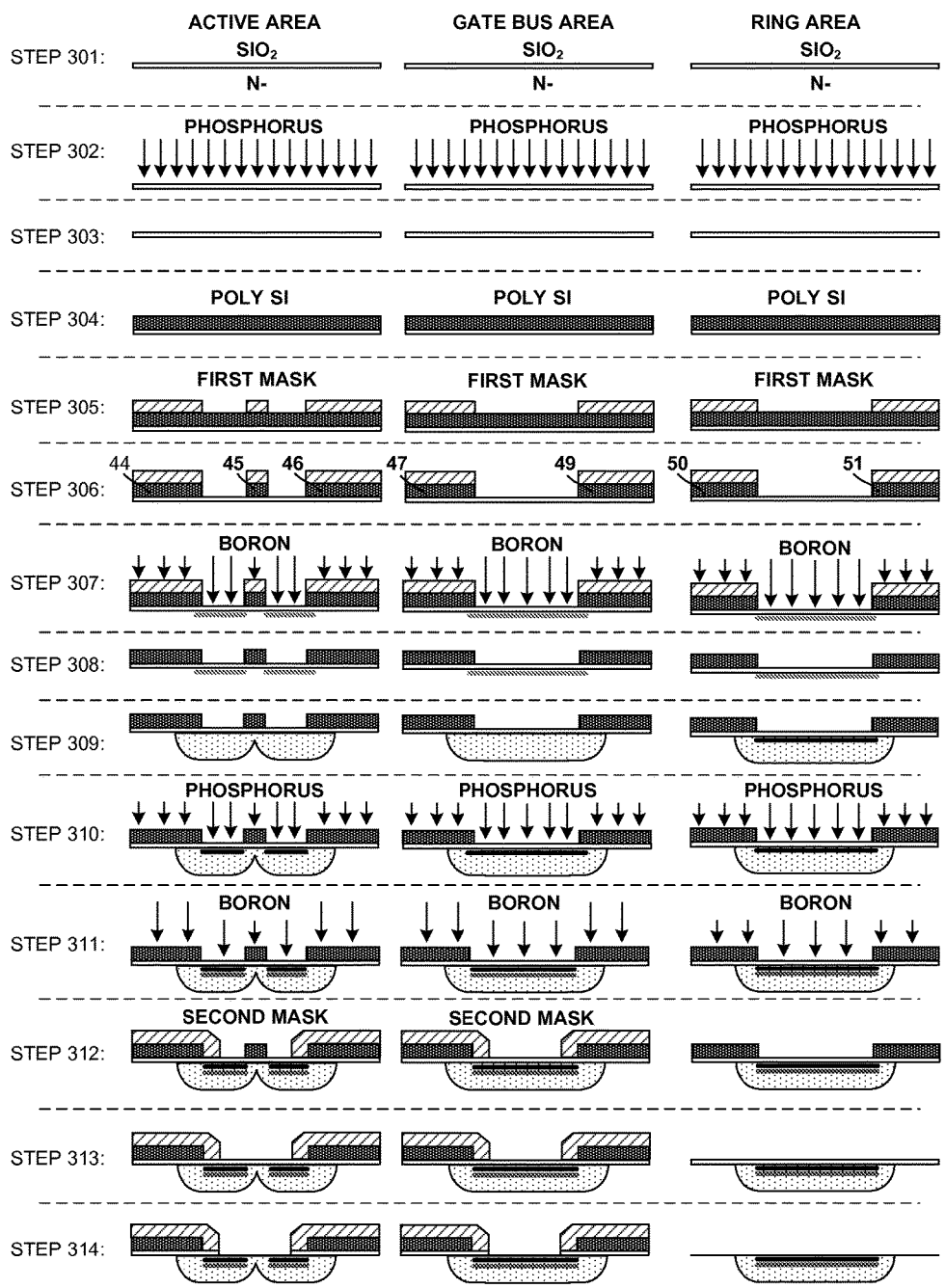
FIG. 7A is a diagram of the first fourteen steps of a twenty five step field effect transistor fabrication process in accordance with a second novel aspect.
Figure 20:
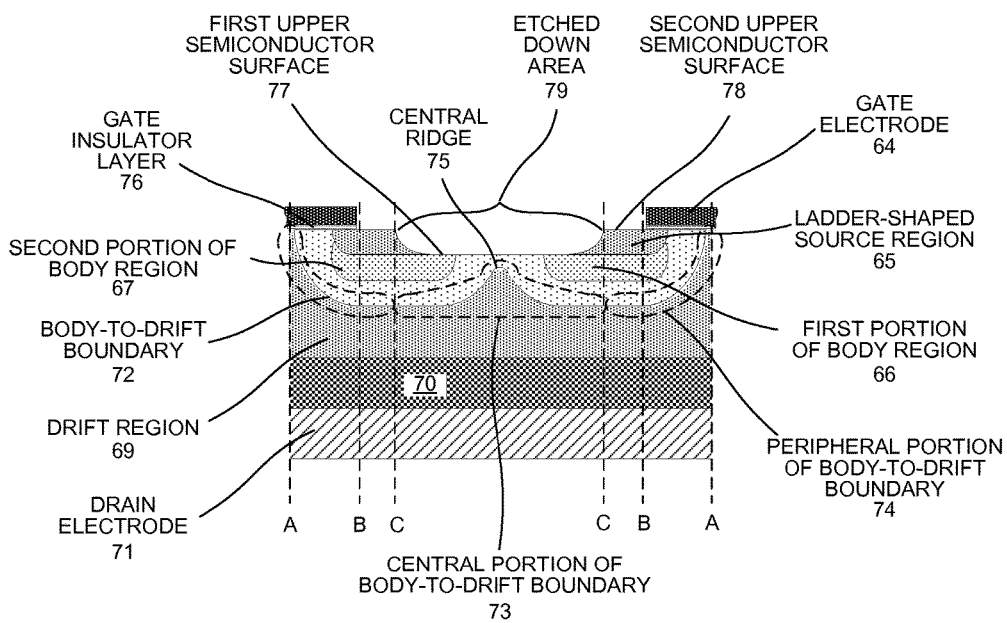
FIG. 20 is a cross-sectional side view taken along sectional line A-A of the integrated circuit shown in FIG. 18 in accordance with a second novel aspect.

FIG. 7A is a diagram of the first fourteen steps of a twenty five step process to fabricate an improved field effect transistor (FET) shown in FIG. 20. Each drawing in FIG. 7A illustrates the formation of a single p well in each area of the FET device. FIG. 7A displays three columns per step. The columns are labeled active area, gate bus area, and ring area. These areas correlate to similarly referenced areas shown in FIG. 16.

A thin oxide is deposited on n type silicon in the active area, gate bus area, and the ring area (step 301). Phosphorus is implanted evenly to the active area, gate bus area, and the ring area (step 302). The implanted phosphorus is diffused (step 303). Phosphorus diffusion may be achieved by an annealing process where the implanted material is heated to a temperature above a diffusion temperature, maintaining a suitable temperature, and then cooling the implanted material to room temperature. A poly silicon layer is deposited over the diffused phosphorus layer (step 304). Poly silicon is a silicon material composed of a number of smaller crystals in which the crystal lattice is non-continuous. A first mask is applied to the active area, gate bus area, and the ring area (step 305). The first mask may be a poly silicon photo mask. In the active area, the first mask is applied to a first poly silicon region 44, a second poly silicon region 45, and a third poly silicon region 46. In the gate bus area, the first mask is applied to a fourth poly silicon region 47, and a sixth poly silicon region 49. In the ring area, the first mask is applied to a seventh poly silicon region 50 and an eighth poly silicon region 51.

The poly silicon material not protected by the first mask is etched away (step 306). Remaining poly silicon regions 44, 46, 47, and 49 are regions where the poly silicon layer will form a gate electrode, as well as control a first implantation of phosphorus and a first and second implantation of boron in the ring area throughout the proceeding steps. Remaining poly silicon regions 50 and 51 are used throughout the proceeding steps to control a first implantation of phosphorus and a first and second implantation of boron in the ring area. Poly silicon region 45 may be referred to as the "body shaping" region because the poly silicon region affects the first implantation of boron, and thus also affect the shape of the resulting central portion of the body-to-drift boundary, where the second portion of the body region meets the drift region in the active area. FIG. 8 is a top-down view of the active area of the semiconductor wafer during step 306 of FIG. 7A. FIG. 8 shows that body shaping region 45, and the first mask deposited thereon, is an island formation located between poly silicon regions 44 and 46, where poly silicon regions 44 and 46, and the first mask deposited thereon, are vertical columns extending the across the active area.

Boron is applied evenly across the active area, gate bus area, and ring area (step 307). As the first mask absorbs all incident boron, boron is implanted only the portion of the drift region not protected by the first mask. The gate oxide layer does not block boron implantation into the drift region. FIG. 9 is an expanded cut-away top-down view of rectangle 53 of FIG. 8 during step 307 of FIG. 7A. The gate oxide layer does not block boron implantation and is omitted in FIG. 9 for illustrative purposes. As is shown in FIG. 9, the portion of the drift region not protected by the first mask is ladder-shaped. As such, the first implantation of boron is only implanted in the exposed ladder-shaped top surface of the drift region. The first poly silicon photo mask is removed from all areas (step 308).

The implanted boron is diffused to create a second body portion of the body region (step 309). A p type body region is also commonly referred to as a "p-well". Boron diffusion may be achieved by an annealing process where the implanted material is heated to a temperature above a diffusion temperature, maintaining a suitable temperature, and then cooling the implanted material to room temperature. FIG. 10 is an expanded cut-away top-down view of rectangle 53 of FIG. 8 during step 309 of FIG. 7A.

The gate oxide layer is omitted in FIG. 10 for illustrative purposes. FIG. 10 shows that from the top-down perspective the top surface of the body region formed in step 309 is ladder-shaped. Depending on the amount of boron implanted and the diffusion processing used, the bottom-up perspective of the body region may be either ladder-shaped or a single continuous surface. Upon completion of step 309, the top surface of the drift region is not exposed to the top surface of the semiconductor wafer.

Phosphorus is applied evenly across the active area, gate bus area, and ring area (step 310). The remaining poly silicon layer absorbs all incident phosphorus. As a result, phosphorus is only implanted in the portion of the second body portion of the body region not protected by the remaining poly silicon layer. FIG. 11 is an expanded cut-away top-down view of rectangle 53 of FIG. 8 during step 310 of FIG. 6A. The gate oxide layer does not block phosphorus implantation and is omitted in FIG. 11 for illustrative purposes. As is shown in FIG. 11, the portion of the body region not protected by the poly silicon layer is ladder-shaped. As such, the first implantation of phosphorus is only implanted into the exposed ladder-shaped top surface of the body region.

Figure 14:
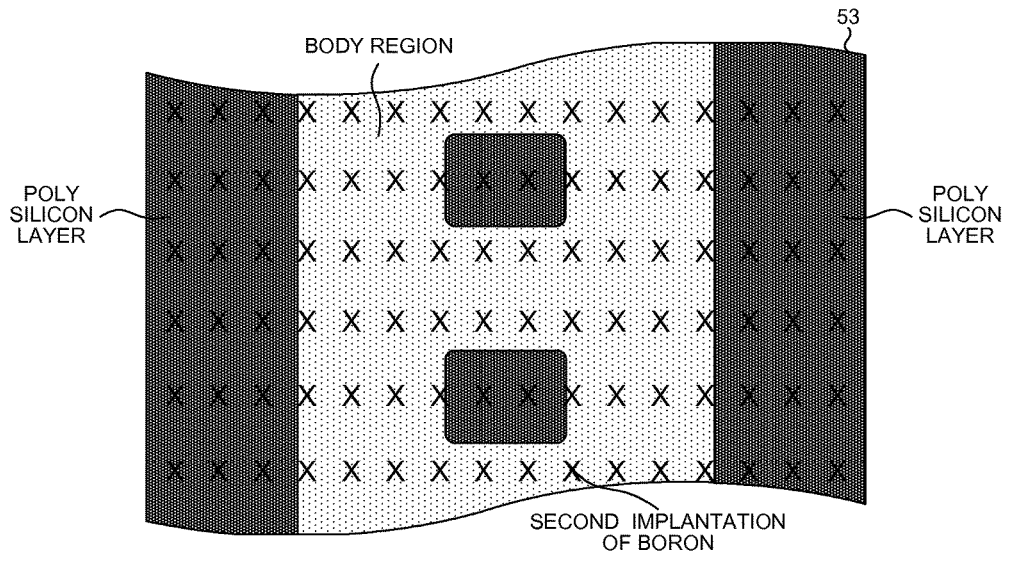
FIG. 14 is an expanded cut-away top-down view of rectangle 53 during step 311 of FIG. 7A.

A second implantation of boron is applied evenly across the active area, gate bus area, and ring area (step 311). The poly silicon layer absorbs all incident boron. As a result, in the active area, boron is only implanted into the exposed ladder-shaped top surface of the body region. FIG. 14 is an expanded cut-away top-down view of rectangle 53 of FIG. 8 during step 311 of FIG. 7A. The gate oxide layer does not block boron implantation and is omitted in FIG. 14 for illustrative purposes. As is shown in FIG. 14, the exposed portion of the body region not protected by the poly silicon layer is ladder-shaped. The width of the exposed ladder-shaped top surface of the body region during the second implantation of boron is equal, or at least approximately equal, to the width of the exposed ladder-shaped top surface of the body region during the first implantation of phosphorus. The second implantation of boron is only implanted into the exposed ladder-shaped top surface of the body region. Likewise, in the gate bus area, the second implantation of boron is only implanted into the exposed ladder-shaped top surface of the body region. In the ring area, boron is only implanted into the exposed top surface of the body region.

A second mask is deposited on the active area and the gate bus area (step 312). The second mask may be a layer of photo resist material. In the active area, the second mask is deposited over the first poly silicon region 44, the third poly silicon region 46, and a portion of the exposed body region. In the gate bus area, the second mask is applied to the fourth poly silicon region 47, the sixth poly silicon region 49, and a portion of the exposed body region. The second mask is not applied to the ring area.

The unprotected poly silicon layer in the ring area is etched away (step 313). As a result, all poly silicon is removed from the ring area. All unprotected portions of the silicon oxide layer are etched away from in the active area, gate bus area, and ring area (step 314).

Figure 7B:
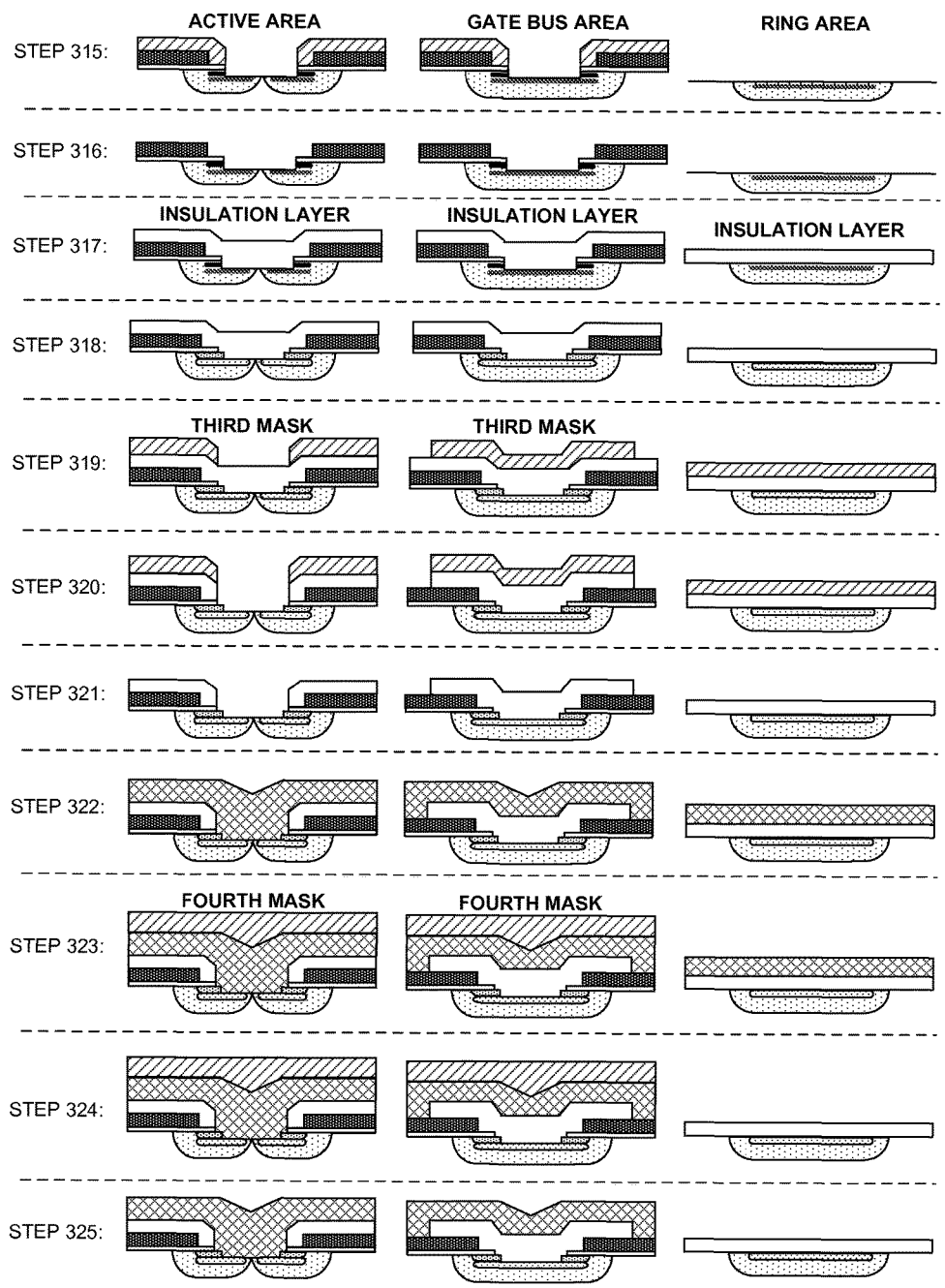
FIG. 7B is a diagram of the last eleven steps of a twenty five step field effect transistor fabrication process in accordance with a second novel aspect.

FIG. 7B is a diagram of the last eleven steps of a twenty five step process to fabricate an improved field effect transistor (FET) shown in FIG. 20. Each drawing in FIG. 7B illustrates the formation of a single p well in each area of the FET device. FIG. 7B displays three columns per step. The columns are labeled active area, gate bus area, and ring area. These areas correlate to similarly referenced areas shown in FIG. 16.

In the active area, gate bus area, and ring area a shallow portion of the body portion, which is not protected by the second mask, is etched away (step 315). The depth of the shallow etching is approximately equal to the depth of the phosphorus implantation. For example, the depth of the phosphorus implantation may be 0.2 micrometers. As a result, a portion of the implanted phosphorus in the body region is etched away; however, the more deeply implanted boron remains in the body region. The shallow etching of step 315 creates an etched down area where the semiconductor surface extends up to a lower first upper semiconductor surface. The portion of the semiconductor not etched away extends up to a second upper semiconductor surface.

The second mask is removed (step 316). An insulation layer is deposed evenly to the active area, gate bus area, and ring area (step 317). The implanted phosphorus and boron is diffused (step 318). Diffusion may be achieved by an annealing process where the implanted material is heated to a temperature above the diffusion temperature, maintaining a suitable temperature, and then cooling the implanted wafer to room temperature. In the active area, gate bus area, and the ring area the diffused first implantation of phosphorus creates an n type source region and the diffused second implantation of boron creates a first portion of the body region. The first portion of the body region has a higher boron concentration than the second portion of the body region because the first portion of the body region is a result of the first and the second boron implantations, whereas the second portion of the body region is the result of only the first boron implantation. The increased boron concentration of the first portion of the body region reduces the parasitic resistance in the first portion of the body region. The reduction in parasitic resistance results in lower voltage generation in the first portion of the body region for a given current. Further, the increased doping of the first portion of the body region provides an improved contact between the first portion of the body region and the source electrode.

Figure 15:
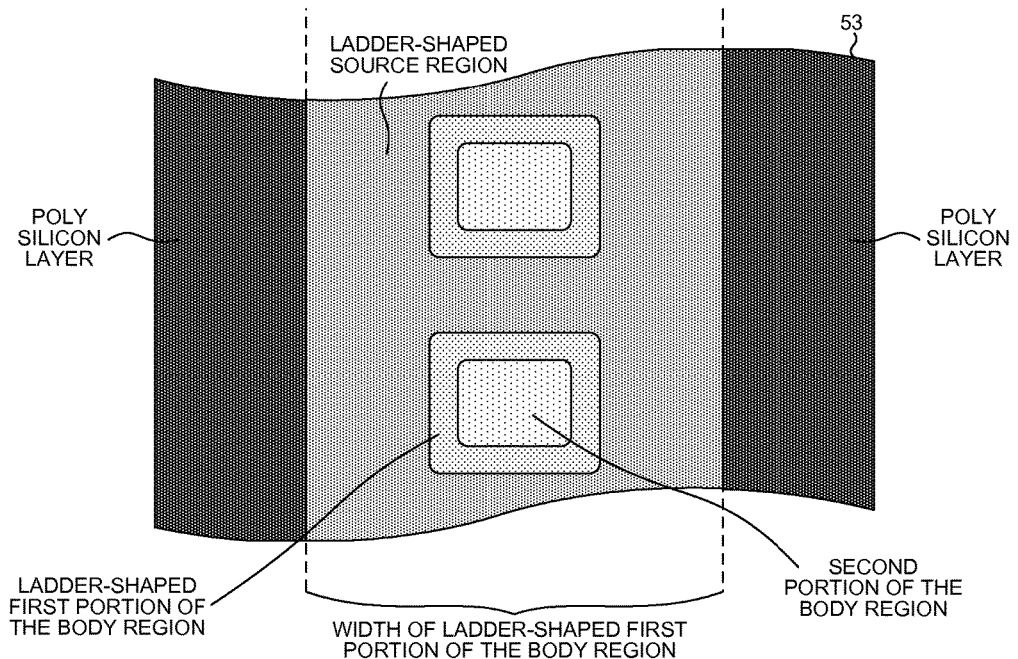
FIG. 15 is an expanded cut-away top-down view of rectangle 53 during step 318 of FIG. 7B.

FIG. 15 is an expanded cut-away top-down view of rectangle 53 of FIG. 8 during step 318 of FIG. 7B. The gate oxide layer and the insulator layer are omitted for illustrative purposes. FIG. 15 shows from a top-down perspective the second portion of the body region, as well as the first portion of the body region is visible within the etched down area that extends up to the first upper semiconductor surface. The ladder-shaped source region extends up to the second upper semiconductor surface from the first upper semiconductor surface. FIG. 15 further illustrates that the underlying first portion of the body region is also ladder-shaped and has a horizontal width which equal, or at least approximately equal, to the horizontal width of the ladder-shaped source region.

A third mask is applied (step 319). The third mask may be a photo resist material. In the active area, the third mask is applied to the insulation layer above the first 44 and third 46 poly silicon regions and a portion of the source region. In the gate bus area, the third mask is applied to the entire area except an area above a portion of the fourth poly silicon region 47 and an area above a portion of the sixth poly silicon region 49. The third mask is also applied to the entire ring area. All unprotected portions of the insulation layer are etched away (step 320). As a result, in the active area, the remaining insulation layer covers the first 44 and second 46 poly silicon regions and a portion of the gate oxide layer. In the gate bus area, a portion of insulation layer above fourth 47 and sixth 49 poly silicon regions is etched away.

The third mask is removed from all areas (step 321). A metal layer is deposited evenly to the active area, gate bus area, and the ring area to form a metal source electrode (step 322). In the active area, the metal layer contacts the first upper semiconductor surface. In the gate bus area, the metal layer contacts a portion of the fourth 47 and sixth 49 poly silicon regions. A fourth mask is applied to the entire active area and gate bus area (step 323). The fourth mask may be a photo resist material. The fourth mask is not applied to the entire ring area. The forth mask may be applied to a portion of the ring area near the gate bus area. The fourth mask may also be applied to a portion of the ring area near the edge of the FET. The fourth mask is not applied to the portion of the ring area shown FIG. 7B. The unprotected metal layer is etched way form the ring area (step 324). In the ring area, the entire metal layer is etched away. The fourth mask is removed (step 325). Completion of step 325 results in the FET shown in FIG. 20.

In the resulting structure, the more highly doped first portion of the body region abuts the entire bottom surface of the source region. The lesser doped second portion of the body region abuts the remaining portion of the bottom surface of the source region. Avalanche current flow through the body region from the drift region into the source electrode. The first portion of the body region has a higher boron concentration and thus lower parasitic resistance. The second portion of the body region has a lower boron concentration and thus a higher parasitic resistance. Thus, the total resistance of the avalanche current path decreases as the percentage of the avalanche current path traveling through the first portion of the body region increases. An improved process minimizing the total resistance along the avalanche current path is disclosed in FIGS. 7A and 7B.

Figure 16:
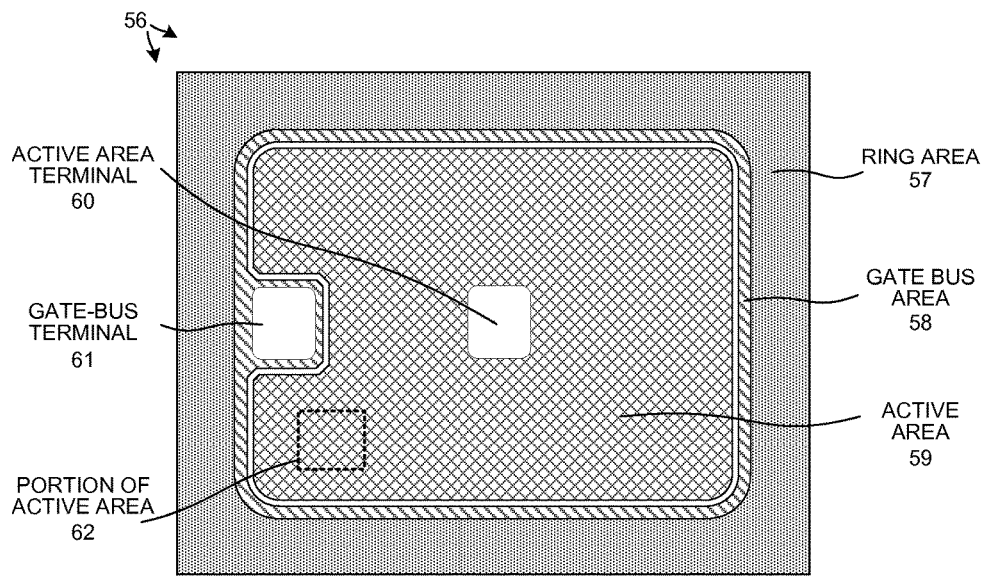
FIG. 16 is a top-down view of a vertical power field-effect transistor in accordance with the first and second novel aspects.

FIG. 16 is a top-down view of vertical power field-effect transistor 56 in accordance with the first and second novel aspects. The top surface of the vertical power FET 56 comprises a ring area 57, a gate bus area 58, an active area 59, a gate bus terminal 61, and a active area terminal 60. The active area 59 is the center area. The gate bus area 58 surrounds the active area 59. The ring area 57 surrounds the gate bus area 58. The active area 59 is where the top metal layer is connected to the body and source regions of the power FET device. The gate bus area 20 is where the top metal layer is connected to the gate electrode so to control the gate voltage. The ring area 19, or junction termination area, allows high voltages to be sustained when operating in blocking mode. A portion of active area 62 is also identified in FIG. 16.

Figure 17:
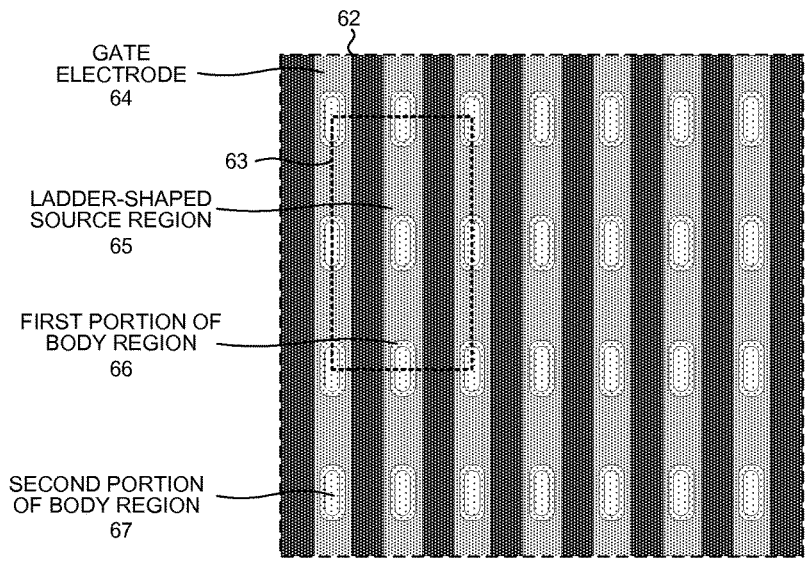
FIG. 17 is an expanded top-down view of rectangle 62 of FIG. 16.

FIG. 17 is an expanded top-down view of rectangle 62 of FIG. 16. Rectangle 62 comprises multiple p wells, each p well comprising a gate electrode 64, a ladder-shaped source region 65, a first portion of the body region 66, and a second portion of the body region 67.

Figure 18:
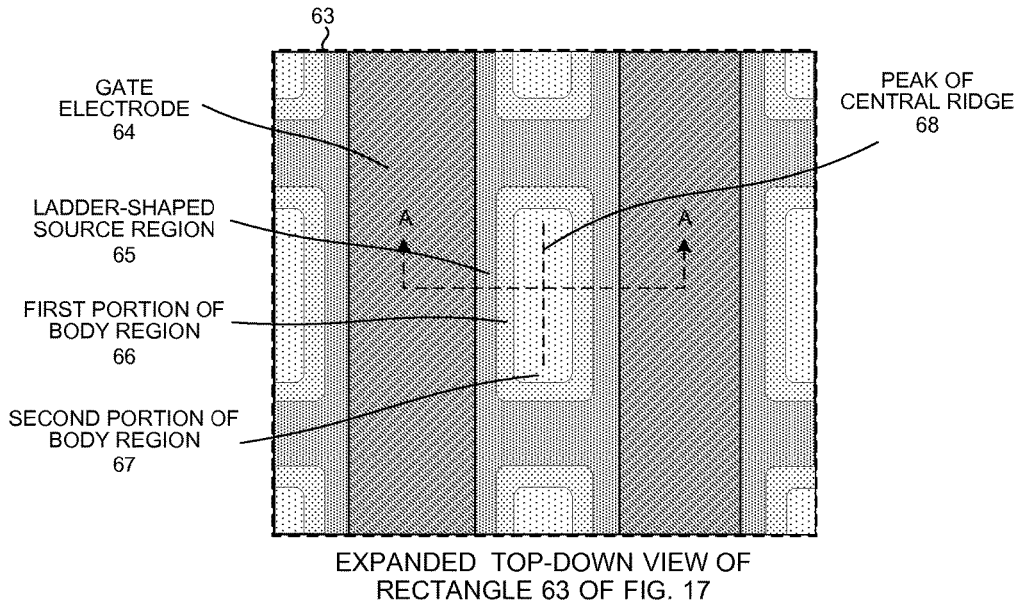
FIG. 18 is an expanded top-down view of rectangle 63 of FIG. 17.

FIG. 18 is an expanded top-down view of rectangle 63 of FIG. 17. FIG. 18 illustrates one full p well in the vertical power field-effect transistor 56 of FIG. 16. The top-down view of the p well shows a gate electrode 64, a ladder-shaped source region 65, a first portion of the body region 66, and a second portion of the body region 67. Dashed line 68 shows the location of a peak of the central ridge of drift region. Where the body region meets the drift region at the body-to-drift boundary. From a top-down perspective, the gate electrode 64 has parallel structure vertically extending along the surface of the active area. The ladder-shaped source region 65, the first portion of the body region 66, and the second portion of the body region are visible within the vertically extending rectangular space between parallel strips of gate electrode 64.

FIG. 19 is a cross-sectional side view taken along sectional line A-A of the integrated circuit shown in FIG. 18 in accordance with a first novel aspect disclosed with respect to FIGS. 6A and 6B. To clarify the illustration, the metal electrode and the insulator layer are not shown in FIG. 19. The cross section of integrated circuit shown in FIG. 19 comprises: a gate electrode 64, a ladder-shaped source region 65, a first portion of the body region 66, a second portion of the body region 67, a drift region 69, substrate region 70, drain electrode 71, the body-to-drift boundary 72, the central portion of the body-to-drift boundary 73, peripheral portion of the body-to-drift boundary 74, central ridge 75, gate insulator layer 76, a first upper surface 77, a second upper surface 78, and etched down area 79.

From the bottom-up, the substrate region 70 is disposed over the drain electrode 71. The drift region 69 is disposed over the substrate region 70. The second portion of the body region 67 extends down to the drift region 69 from the first 77 and second 78 upper semiconductor surface. The ladder-shaped source region 65 extends down into the second portion of the body region 67 from the second upper semiconductor surface 78. The first upper semiconductor surface 77 is substantially planar. The second upper semiconductor surface 78 is substantially planar. The first 77 and second 78 upper semiconductor surfaces are not coplanar. The first portion of the body region 66 is disposed at least in part under the source region 65. The first portion of the body region 66 is surrounded laterally by the second portion of the body region 67. The second portion of the body region 67 and the drift region 69 meet at the body-to-drift boundary 72. The body-to-drift boundary 72 has a central portion 73. The central portion 73 of the body-to-drift boundary is directly beneath the first upper semiconductor surface 77, and where the central portion of the body-to-drift boundary 73 is non-planar. The gate insulator layer 76 is disposed over the source region 65. The gate electrode 64 disposed over the gate insulator layer 76. The central portion of the drift region 69 forms a central ridge 75 that extends upward toward the first upper semiconductor surface 77. The ridge is an extension of the other portion of the drift region. Central ridge 75 is disposed directly beneath the first upper semiconductor surface 77. In the example of FIG. 19, substantially no portion of the central ridge 75 is disposed directly beneath any part of the source region 65.

Body-to-drift boundary 72 is the boundary where the drift region 69 meets the second portion of the body region 67. Body-to-drift boundary 72 has a central portion 73 and a peripheral portion 74. The central portion 73 of the body-to-drift boundary is located along the body-to-drift boundary 72 between sectional lines C-C shown in FIG. 19. The peripheral portion 74 of the body-to-drift boundary is located along the body-to-drift boundary 72 between sectional lines A-C and C-A shown in FIG. 19. Each portion of the body-to-drift boundary 72 is outlined with a dashed line for clarity. The central portion of the body-to-drift boundary 73 is not planar. Rather, the central portion of the drift region 69 forms a central ridge 75 toward the first upper semiconductor surface 77. It is noted that the depth and pitch of the central ridge 75 may be varied. The exact shape, height, and pitch shown in FIG. 19 is only an exemplary embodiment to illustrate one novel aspect. Other non-planar shapes may be formed in the central portion of the body-to-drift region 73 to attain the same effect. For example, in the embodiment shown in FIG. 19 the central ridge 75 does not contact the first upper semiconductor surface 77. However, in an alternative embodiment, the central ridge 75 does contact the first upper semiconductor surface 77.

The gate insulator 65 extends down to the second upper semiconductor surface 67 from the bottom surface of the gate electrode 61. In an embodiment, gate insulator 65 comprises silicon oxide and gate electrode 61 comprises poly silicon.

The second portion of the body region 67 illustrated in FIG. 19 is not ladder-shaped; however, it is noted that in other embodiments the second portion of the body region 67 may be ladder-shaped.

The first portion of the body region 66 has a first doping concentration. The second portion of the body region 67 has a second doping concentration. The first doping concentration is greater than the second doping concentration. In one embodiment, the first 66 and second 67 portions of the body region are doped with a group 13 element. In another embodiment the first 66 and second 67 portions of the body region 66 are doped with boron. Doping of the first 66 and second 67 portions of the body region may be conducted in one or more doping events.

The first portion of the body region 66 is a ladder-shaped region extending in three dimensions. The first portion of the body region 66 has an inner width and an outer width. From the cross-sectional view shown in FIG. 19, the inner and outer widths of the first portion of the body region 66 are measured along the horizontal axis. From the cross-sectional view shown in FIG. 19, the depth of the first portion of the body region 66 is measured along the vertical axis. In an exemplary embodiment, the depth of the first portion of the body region is 0.4 micrometers and the outer width of the first portion of the body region is 6 micrometers.

The second portion of the body region 67 also has a depth. From the cross-sectional view shown in FIG. 19, the depth of the second portion of the body region 67 is measured along a vertical axis. The maximum depth of the second portion of the body region 67 is the vertical distance between the second upper semiconductor surface 78 and the deepest point along the body-to-drift boundary 72. In an exemplary embodiment, the maximum depth of the second portion of the body region is 0.8 micrometers and the outer width of the second portion of the body region is 12 micrometers.

In an embodiment the ladder-shaped source region 65 is doped with a group five element. In another embodiment the ladder-shaped source region 65 is doped with phosphorus.

The ladder-shaped source region 65 is a ladder-shaped region extending in three dimensions. As such, the cross-sectional view in FIG. 19 of ladder-shaped source region 65 shows two non-contiguous regions. The ladder-shaped source region 65 has an inner width and an outer width. From the cross-sectional view shown in FIG. 19, the inner and outer widths of the ladder-shaped source regions 65 are measured along the horizontal axis. From the cross-sectional view shown in FIG. 19, the ladder-shaped source region 65 has a depth. The depth of the ladder-shaped source region 65 is measured along the vertical axis. In an exemplary embodiment, the depth of the ladder-shaped source region 65 is 0.2 micrometers and the outer width of the ladder-shaped source region is 10 micrometers.

In an embodiment, the ladder-shaped source region 65 has a first outer width, the ladder-shaped first portion of the body region 66 has a second outer width, and the first outer width is greater than the second outer width.

In one embodiment, the first upper semiconductor surface 77 extends in a first plane, the second upper semiconductor surface 78 extends in a second plane, the first and second planes extend parallel to one another but are not coplanar, and the ladder-shaped source region 65 has a maximum depth that is not greater than a distance between the first and second planes.

In an alternative embodiment, the first upper semiconductor surface 77 extends in a first plane, the second upper semiconductor surface 78 extends in a second plane, the first and second planes extend parallel to one another but are not coplanar, and the ladder-shaped source region 65 has a maximum depth that is equal to, or greater than, a distance between the first and second planes.

FIG. 20 is a cross-sectional side view taken along sectional line A-A of the integrated circuit shown in FIG. 18 in accordance with a first novel aspect disclosed with respect to FIGS. 7A and 7B. For the sake of simplicity, the metal electrode and the insulator layer are not shown in FIG. 20. The cross section of integrated circuit shown in FIG. 20 comprises: a gate electrode 64, a ladder-shaped source region 65, a first portion of the body region 66, a second portion of the body region 67, a drift region 69, substrate region 70, drain electrode 71, the body-to-drift boundary 72, the central portion of the body-to-drift boundary 73, peripheral portion of the body-to-drift boundary 74, central ridge 75, gate insulator layer 76, a first upper surface 77, a second upper surface 78, and etched down area 79.

From the bottom-up, the substrate region 70 is disposed over the drain electrode 71. The drift region 69 is disposed over the substrate region 70. The second portion of the body region 67 extends down to the drift region 69 from the first 77 and second 78 upper semiconductor surface. The ladder-shaped source region 65 extends down into the second portion of the body region 67 from the second upper semiconductor surface 78. The first upper semiconductor surface 77 is substantially planar. The second upper semiconductor surface 78 is substantially planar. The first 77 and second 78 upper semiconductor surfaces are not coplanar. The first portion of the body region 66 is disposed at least in part under the source region 65. The first portion of the body region 66 is surrounded laterally by the second portion of the body region 67. The second portion of the body region 67 and the drift region 69 meet at the body-to-drift boundary 72. The body-to-drift boundary 72 has a central portion 73. The central portion of the body-to-drift boundary 73 is directly beneath the first upper semiconductor surface 77, and where the central portion of the body-to-drift boundary 73 is non-planar. The gate insulator layer 76 is disposed over the source region 65. The gate electrode 64 disposed over the gate insulator layer 76. The central portion of the drift region 69 forms a central ridge 75 that extends upward toward the first upper semiconductor surface 77. The central ridge 75 is disposed directly beneath the first upper semiconductor surface 77 and substantially no portion of the central ridge 75 is disposed directly beneath any part of the source region 65.

The body-to-drift boundary 72 is where the drift region 69 meets the second portion of the body region 67. The body-to-drift boundary 72 has a central portion 73 and a peripheral portion 74. The central portion of the body-to-drift boundary 73 is located along the body-to-drift boundary 72 between sectional lines C-C shown in FIG. 20. The peripheral portion of the body-to-drift boundary 74 is located along the body-to-drift boundary 72 between sectional lines A-C and C-A shown in FIG. 20. Each portion of the body-to-drift boundary 72 is outlined with a dashed line for clarity. The central portion of the body-to-drift boundary 73 is not planar. Rather, the central portion of drift region 69 forms a central ridge 75 toward the first upper semiconductor surface 77. It is noted that the depth and pitch of the central ridge 75 may be varied. The exact shape, height, and pitch shown in FIG. 20 is only an exemplary embodiment to illustrate one novel aspect. Other non-planar shapes may be formed in the central portion of the body-to-drift region 73 to attain the same effect. For example, in the embodiment shown in FIG. 20 the central ridge 75 does not contact the first upper semiconductor surface 77. However, in an alternative embodiment, the central ridge 75 can contact the first upper semiconductor surface 77.

The gate insulator 65 extends down to the second upper semiconductor surface 67 from the bottom surface of the gate electrode 61. In an embodiment, gate insulator 65 comprises silicon oxide and gate electrode 61 comprises poly silicon.

The second portion of the body region 67 illustrated in FIG. 20 is not ladder-shaped; however, it is noted that in other embodiments the second portion of the body region 67 may be ladder-shaped.

The first portion of the body region 66 has a first doping concentration. The second portion of the body region 67 has a second doping concentration. The first doping concentration is greater than the second doping concentration. In one embodiment, the first 66 and second 67 portions of the body region are doped with a group 13 element. In another embodiment the first 66 and second 67 portions of the body region 66 are doped with boron. Doping of the first 66 and second 67 portions of the body region may be conducted in one or more doping events.

The first portion of the body region 66 is a ladder-shaped region extending in three dimensions. As such, the cross-sectional view shown in FIG. 20 of first portion of the body region 66 shows two non-contiguous regions. The first portion of the body region 66 has an inner width and an outer width. From the cross-sectional view shown in FIG. 20, the inner and outer widths of the first portion of the body region 66 are measured along the horizontal axis. From the cross-sectional view shown in FIG. 20, the first portion of the body region 66 is measured along the vertical axis. In an exemplary embodiment, the depth of the first portion of the body region is 0.2 micrometers and the outer width of the first portion of the body region is 10 micrometers.

The second portion of the body region 67 also has a depth. From the cross-sectional view shown in FIG. 20, the depth of the second portion of the body region 67 is measured along a vertical axis. The maximum depth of the second portion of the body region 67 is the vertical distance between the second upper semiconductor surface 78 and the deepest point along the body-to-drift boundary 72. In an exemplary embodiment, the maximum depth of the second portion of the body region is 0.8 micrometers and the outer width of the second portion of the body region is 12 micrometers.

In an embodiment the ladder-shaped source region 65 is doped with a group five element. In another embodiment the ladder-shaped source region 65 is doped with phosphorus.

The ladder-shaped source region 65 is a ladder-shaped region extending in three dimensions. As such, the cross-sectional view in FIG. 20 of ladder-shaped source region 65 shows two non-contiguous regions. The ladder-shaped source region 65 has an inner width and an outer width. From the cross-sectional view shown in FIG. 20, the inner and outer widths of the ladder-shaped source regions 65 are measured along the horizontal axis. From the cross-sectional view shown in FIG. 20, the ladder-shaped source region 65 has a depth. The depth of the ladder-shaped source region 65 is measured along the vertical axis. In an exemplary embodiment, the depth of the ladder-shaped source region 65 is 0.2 micrometers and the outer width of the ladder-shaped source region is 10 micrometers.

In an embodiment, the ladder-shaped source region 65 has a first width, the ladder-shaped first portion of the body region 66 has a second width, and the first width is approximately equal to the second width.

In one embodiment, the first upper semiconductor surface 77 extends in a first plane, the second upper semiconductor surface 78 extends in a second plane, the first and second planes extend parallel to one another but are not coplanar, and the ladder-shaped source region 65 has a maximum depth that is not greater than a distance between the first and second planes.

In an alternative embodiment, the first upper semiconductor surface 77 extends in a first plane, the second upper semiconductor surface 78 extends in a second plane, the first and second planes extend parallel to one another but are not coplanar, and the ladder-shaped source region 65 has a maximum depth that is equal to, or greater than, a distance between the first and second planes.

Figure 21:
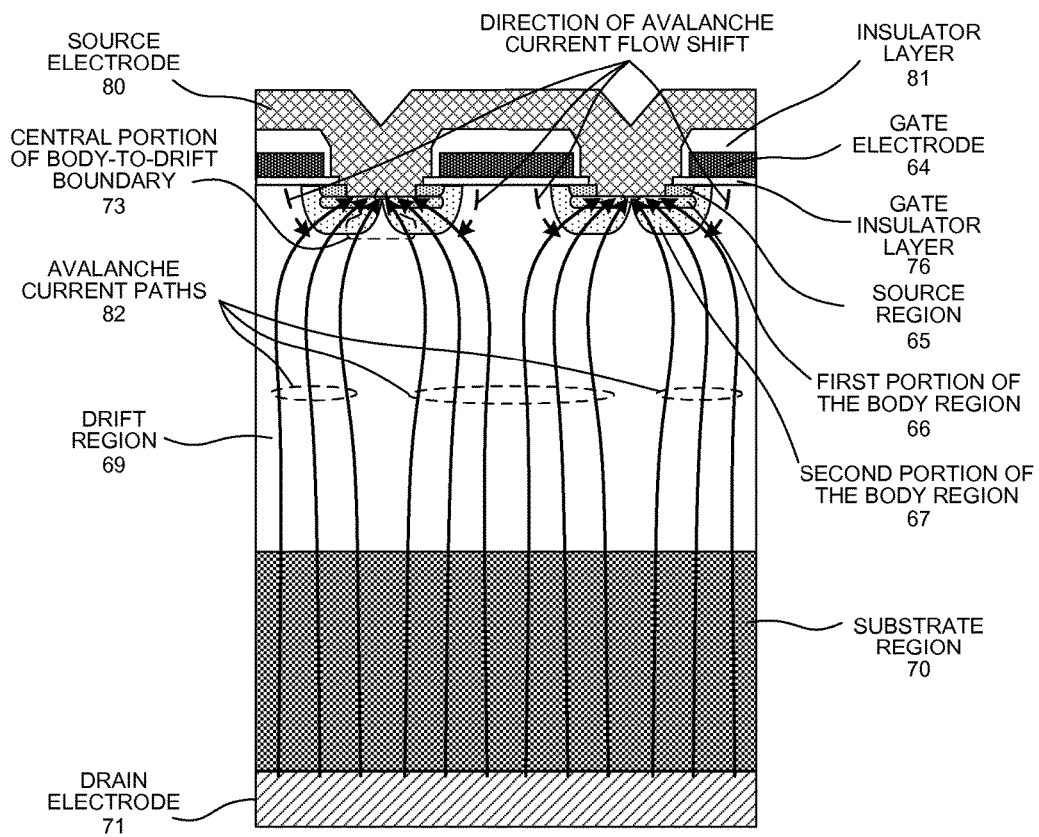
FIG. 21 is a cross-sectional view of the active region of the power field-effect transistor in accordance with the first and second novel aspects.

FIG. 21 is a cross-sectional view of the integrated circuit shown in FIG. 20 illustrating the avalanche current path flow. The active region comprises a metal electrode 80, an insulator layer 81, a gate electrode 64, a gate insulator layer 76, a ladder-shaped source region 65, a first portion of the body region 66, a second portion of the body region 67, a drift region 69, a substrate region 70, a drain electrode 71, and central portion of the body-to-drift boundary 73. Avalanche current paths 82 illustrate the path along which avalanche current travels from the drain electrode region 71 to the source electrode 80. The central portion of the body-to-drift boundary 73 is outlined for clarity.

As discussed with respect to FIG. 3, the two causes for power FET failure are "bipolar (active mode) failure" and "thermal (passive mode) failure", both of which are caused by avalanche current flow through the body region. The body region has an inherent resistance per unit length. In the presence of avalanche currents, the inherent body resistance induces an ohmic voltage drop in the body region (V=IR). As the length of the avalanche current path within the p type body region increases, the voltage generated in the body also increases. Conversely, as the distance of avalanche current path within the body region decreases, the voltage generated in the body also decreases.

The avalanche current has the greatest current density near the sharpest angle of the body-to-drift boundary. The non-planar central portion of the body-to-drift boundary 73 alters the area along which the avalanche currents flow into the body region. The peak of the avalanche current path enters the body region at a point along the body-to-drift boundary that is located approximately beneath the source region. The avalanche current path intersects the body-to-drift boundary across an area which is approximately beneath the source region. The dashed arrows show the direction the avalanche currents are shifted due to the non-planar central portion of the body-to-drift boundary in comparison to the avalanche current flow shown in FIG. 5. Shifting the avalanche current paths toward the central portion of the body-to-drift boundary spreads the avalanche current paths across a larger area in comparison to the avalanche current paths shown in FIG. 5. Shifting the avalanche current path closer to the central portion of the body-to-drift boundary 73 reduces the length of the avalanche current path within the body region. The reduction in the avalanche current path length within the body region reduces the total resistance of the avalanche current path. The reduction in resistance of the avalanche current path results in the avalanche current generating a lower voltage drop in the portion of the body region beneath the source region. The reduced voltage drop in the body region for a given current allows the FET device to withstand higher currents along the avalanche current path without suffering from bipolar (active mode) failure.

While the FET resulting from the steps disclosed in FIGS. 7A and 7B (FET structure shown in FIG. 20) is discussed herein with respect to FIG. 21, the same phenomenon applies to the FET device resulting from the steps disclosed in FIGS. 6A and 6B (FET structure shown in FIG. 19).

FIG. 22 is a table that sets forth doping concentrations in the various regions and layers of the structure of the FET devices of FIGS. 19 and 20.

Figure 23:
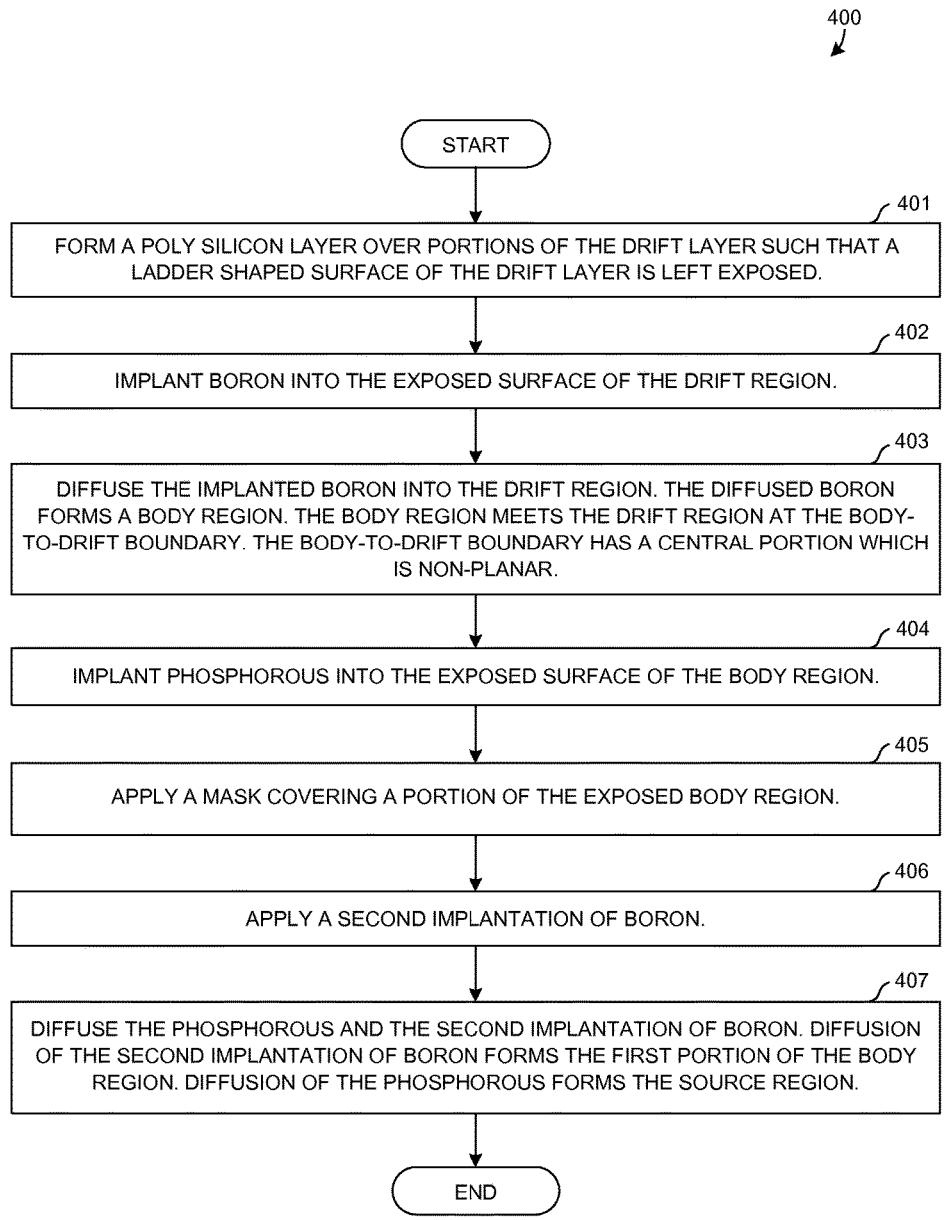
FIG. 23 is a simplified flowchart of a method 400 in accordance with a first novel aspect.

FIG. 23 is a simplified flowchart of a method 400 in accordance with a first novel aspect in which the first seven steps are described. Forming a poly silicon layer (step 401) over portions of the drift layer such that a ladder-shaped surface of the drift layer is left exposed. Implanting boron (step 402) into the exposed surface of the drift region. Diffusing the implanted boron (step 403) into the drift region. The diffused boron forms a body region. The body region meets the drift region at a body-to-drift boundary. The body-to-drift boundary has a central portion which is non-planar. Implanting phosphorus into the exposed surface of the body region (step 404). Applying a mask (step 405) covering a portion of the exposed body region. Applying a second implantation of boron (step 406). Diffusing the phosphorus and the second implantation of boron (step 407). Diffusion of the second implantation of boron forms the first portion of the body region. Diffusion of the phosphorus forms the source region.

As a result of the non-overlapping first implantation of the phosphorus and the second implantation of boron, the first portion of the body region abuts a portion of the bottom surface of the source region. Thus reducing the total resistance of the avalanche current path. Additionally, the central portion of the body-to-drift boundary is non-planar due to the first implantation of boron into a ladder-shaped exposed area of the drift region. Thus, reducing the total length, and subsequently further reducing the total resistance, of the avalanche current path.

Figure 24:
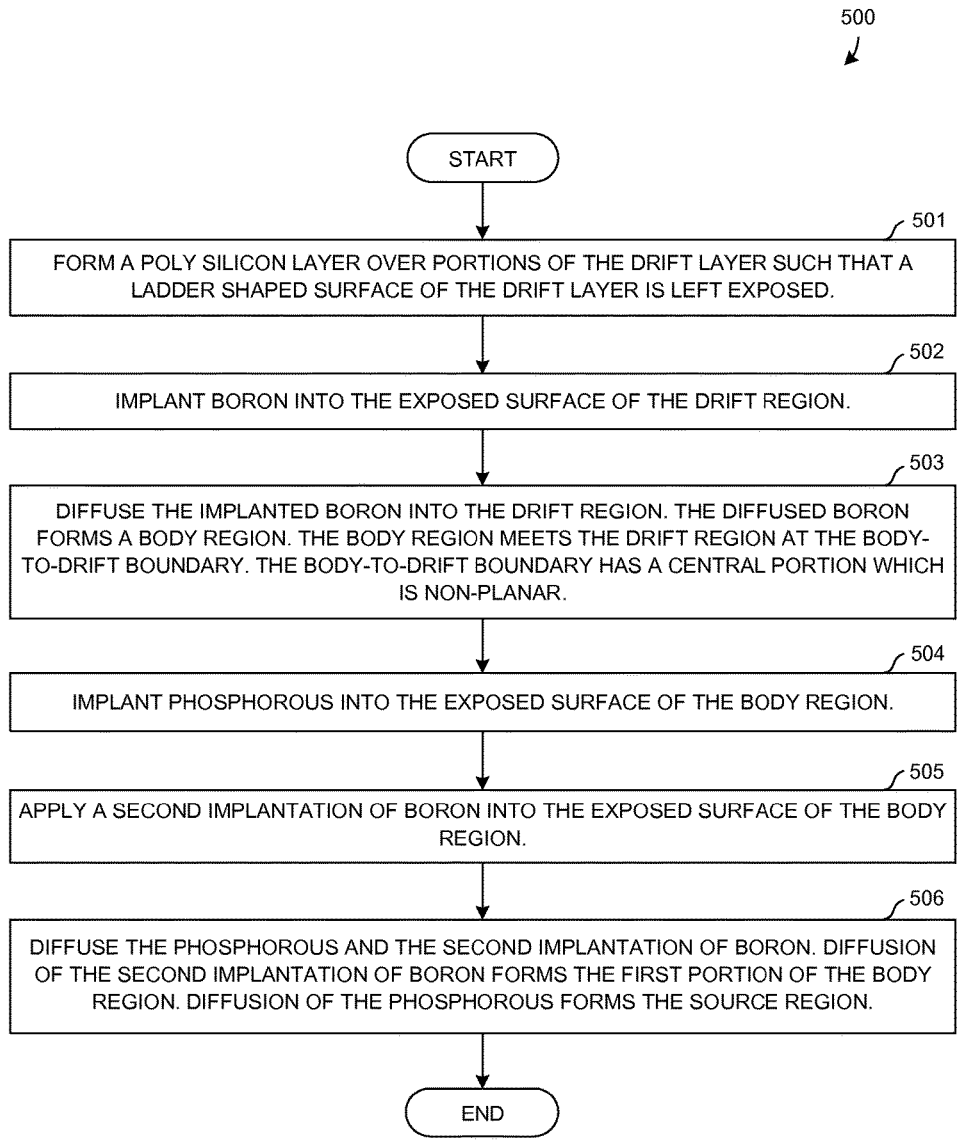
FIG. 24 is a simplified flowchart of a method 500 in accordance with a first novel aspect.

FIG. 24 is a simplified flowchart of a method 500 in accordance with a first novel aspect in which the first 6 steps are described. Form a poly silicon layer over portions of the drift layer such that a ladder-shaped surface of the drift layer is left exposed (step 501). Implant boron into the exposed surface of the drift region (step 502). Diffuse the implanted boron into the drift region (step 503). The diffused boron forms a body region. The body region meets the drift region at a body-to-drift boundary. The body-to-drift boundary has a central portion which is non-planar. Implant phosphorus into the exposed surface of the body region (step 504). Apply a second implantation of boron (step 505). Diffuse the phosphorus and the second implantation of boron (step 506). Diffusion of the second implantation of boron forms the first portion of the body region. Diffusion of the phosphorus forms the source region.

As a result of the overlapping first implantation of phosphorus and the second implantation of boron, the first portion of the body region abuts substantially the entire bottom surface of the source region. Thus, further reducing the total resistance of the avalanche current path. Additionally, the central portion of the body-to-drift boundary is non-planar due to the first implantation of boron into a ladder-shaped exposed area of the drift region. Thus, reducing the total length, and subsequently further reducing the total resistance, of the avalanche current path.

Although certain specific embodiments are described above for instructional purposes, the teachings of this patent document have general applicability and are not limited to the specific embodiments described above. Although the power transistor is described above in an application involving a specific n-channel vertical power field effect transistor technology, the power transistor is of general applicability in other power transistor devices including p-channel vertical power field effect transistor, p-channel insulated gate bipolar transistor, and n-channel insulated gate bipolar transistor. Although examples of specific dopants are provided herein, other well known semiconductor dopants may be utilized and will be readily apparent to one skilled in the art.

Accordingly, various modifications, adaptations, and combinations of various features of the described embodiments can be practiced without departing from the scope of the invention as set forth in the claims.

What is claimed is:

1. A method comprising:
   (a) forming a drift region;
   (b) forming a body region which extends down into the drift region from a first upper semiconductor surface, wherein the first upper semiconductor surface extends in a first plane, wherein the body region meets the drift region at a body-to-drift boundary, wherein the body-to-drift boundary has a central portion, wherein the central portion of the body-to-drift boundary is non-planar, and wherein the drift region forms a central ridge that extends upward toward the first upper semiconductor surface; and
   (c) forming a source region which extends down into the body region from a second upper semiconductor surface, wherein the second upper semiconductor surface extends in a second plane, wherein a maximum depth of the source region is not greater than a distance between the first plane and the second plane, and wherein the first upper semiconductor surface and the second upper semiconductor surface are not coplanar.

2. The method of claim 1, wherein the first upper semiconductor surface and the second upper semiconductor surface extend parallel to one another.

3. The method of claim 1, wherein forming the body region of (b) further comprises:
   (b1) forming a poly silicon layer over portions of the drift region such that only a first area of the drift region is exposed;
   (b2) applying a first implantation of boron to the first area of the drift region; and
   (b3) diffusing the first implantation of boron.

4. The method of claim 3, further comprising:
   (d) forming a first portion of the body region and a second portion of the body region, wherein the first portion of the body region has a first doping concentration, wherein the second portion of the body region has a second doping concentration, and wherein the first doping concentration is greater than the second doping concentration.

5. The method of claim 4, wherein the (d) forming the first portion of the body region and the second portion of the body region, further comprises:
   (d1) applying a first implantation of phosphorus to a first area of the body region not protected by the poly silicon layer;
   (d2) forming a mask layer over at least a portion of the exposed body region such that a second area of the body region remains exposed, wherein the second area is a subarea of the first area;
   (d3) applying the second implantation of boron, wherein the second implantation of boron is implanted in the second area of the body region; and
   (d4) diffusing the first implantation of phosphorus and the second implantation of boron, wherein the diffused first implantation of phosphorus forms the source region, wherein the diffused second implantation of boron forms the first portion of the body region, and wherein the remaining portion of the body region resulting from the diffused first implantation of boron forms the second portion of the body region.

6. The method of claim 1, wherein the drift region, the body region, and the source region are regions of a field effect transistor.

7. The method of claim 1, wherein the central portion is not disposed beneath any source region.

8. The method of claim 1, wherein a portion of the body region that is above the central portion contacts the first upper semiconductor surface.

9. A method comprising:
   (a) forming a drift region;
   (b) forming a body region which extends down into the drift region from a first upper semiconductor surface, wherein the body region meets the drift region at a body-to-drift boundary, wherein the body-to-drift boundary has a central portion, wherein the central portion of the body-to-drift boundary is non-planar, wherein the drift region forms a central ridge that extends upward toward the first upper semiconductor surface, and wherein forming the body region of (b) further comprises:
      (b1) forming a poly silicon layer over portions of the drift region such that only a first area of the drift region is exposed;
      (b2) applying a first implantation of boron to the first area of the drift region; and
      (b3) diffusing the first implantation of boron; and
   (c) forming a source region which extends down into the body region from a second upper semiconductor surface, wherein the first upper semiconductor surface and the second upper semiconductor surface are not coplanar, and wherein the first area of the drift region is ladder-shaped.

10. A method comprising:
   (a) forming a drift region;
   (b) forming a body region which extends down into the drift region from a first upper semiconductor surface, wherein the body region meets the drift region at a body-to-drift boundary, wherein the body-to-drift boundary has a central portion, wherein the central portion of the body-to-drift boundary is non-planar, wherein a central portion of the drift region forms a ridge that extends upward toward the first upper semiconductor surface, and wherein forming the body region of (b) further comprises:
      (b1) forming a poly silicon layer over portions of the drift region such that only a first area of the drift region is exposed;
      (b2) applying a first implantation of boron to the first area of the drift region; and
      (b3) diffusing the first implantation of boron;
   (c) forming a source region which extends down into the body region from a second upper semiconductor surface, wherein the first upper semiconductor surface and the second upper semiconductor surface are not disposed on a same plane; and
   (d) forming a first portion of the body region and a second portion of the body region, wherein the first portion of the body region has a first doping concentration, wherein the second portion of the body region has a second doping concentration, wherein the first doping concentration is greater than the second doping concentration, and wherein the forming the first portion of the body region and the second portion of the body region of (d), further comprises:
      (d1) applying a first implantation of phosphorus to a first area of the body region not protected by the poly silicon layer;

(d2) applying a second implantation of boron to the first area of the body region; and (d3) diffusing the first implantation of phosphorus and the second implantation of boron, wherein the diffused first implantation of phosphorus forms the source region, wherein the diffused second implantation of boron forms the first portion of the body region, and wherein the remaining portion of the body region resulting from the diffused first implantation of boron forms the second portion of the body region.

11. A method comprising:

(a) forming a poly silicon layer over portions of a drift region, wherein a surface of the drift region is exposed;

(b) implanting boron into the surface of the drift region that is exposed;

(c) diffusing the implanted boron into the drift region thereby forming a body region, wherein a surface of the body region is exposed;

(d) implanting phosphorous into the surface of the body region that is exposed;

(e) applying a mask to a portion of the surface of the body region that is exposed;

(f) implanting boron to the surface of the body region that is exposed and not covered by the mask applied in (e); and (g) diffusing the phosphorus implanted in (d) and the boron implanted in (f), wherein the diffusing of the phosphorus forms a source region, wherein the diffusing of the boron forms a first portion of the body region, and wherein the first portion of the body region has a higher boron concentration than a second portion of the body region.

12. The method of claim 11, wherein the surface of the drift region of (a) that is exposed is ladder shaped.

13. The method of claim 11, wherein a body-to-drift boundary is formed where the second portion of the body region contacts the drift region.

14. The method of claim 13, wherein the body-to-drift boundary has a central portion that is non-planar.

15. The method of claim 11, wherein the drift region, the body region, and the source region are parts of a field effect transistor.

16. A method comprising:

(a) forming a poly silicon layer over portions of a drift region, wherein a surface of the drift region is exposed;

(b) applying a first boron implantation onto the surface of the drift region that is exposed;

(c) diffusing the first boron implantation applied in (b) into the drift region such that a body region is formed, wherein a surface of the body region is exposed;

(d) applying a phosphorous implantation onto the surface of the body region that is exposed;

(e) applying a second boron implantation onto a portion of the surface of the body region that is exposed, wherein the second boron implantation is applied in (e) after the phosphorous implantation is applied in (d); and (f) diffusing the phosphorous implantation applied in (d) and the second boron implantation applied in (e), wherein the diffusing of the phosphorus implantation forms a source region, wherein the diffusing of the second boron implantation forms a first portion of the body region having a first doping concentration, and wherein a second portion of the body region has a second doping concentration.

17. The method of claim 16, further comprising:

(g) masking a portion of the surface of the body region before the applying of the second boron implantation of (e), wherein the second boron implantation is applied to the portion of the surface of the body region that is not masked.

18. The method of claim 16, wherein the first doping concentration of the first portion of the body region is greater than the second doping concentration of the second portion of the body region.

19. The method of claim 16, wherein the surface of the drift region of (a) that is exposed is ladder shaped.

20. The method of claim 16, wherein a body-to-drift boundary is formed where the second portion of the body region contacts the drift region.

21. The method of claim 20, wherein the body-to-drift boundary has a central portion that is non-planar.

22. The method of claim 16, wherein the drift region, the body region, and the source region are parts of a field effect transistor.

23. A method comprising:

(a) forming a drift region;

(b) forming a body region which extends down into the drift region from a first upper semiconductor surface, wherein the body region meets the drift region at a body-to-drift boundary, wherein the body-to-drift boundary has a central portion, wherein the central portion of the body-to-drift boundary is non-planar, and wherein a central portion of the drift region forms a ridge that extends upward toward the first upper semiconductor surface; and (c) forming a source region which extends down into the body region from a second upper semiconductor surface, wherein the second upper semiconductor surface extends in a plane different from which the first upper semiconductor surface extends, wherein a bottom surface of the source region is coplanar with the first upper semiconductor surface, and wherein no part of the central portion of the drift region is directly below the source region.

* * * * *